(12) United States Patent
Kumaki et al.

(10) Patent No.: US 7,737,626 B2
(45) Date of Patent: Jun. 15, 2010

(54) LIGHT EMITTING ELEMENT

(75) Inventors: Daisuke Kumaki, Nigata (JP); Satoshi Seo, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 203 days.

(21) Appl. No.: 10/581,410

(22) PCT Filed: Sep. 26, 2005

(86) PCT No.: PCT/JP2005/018226

§ 371 (c)(1),
(2), (4) Date: Jun. 1, 2006

(87) PCT Pub. No.: WO2006/035958

PCT Pub. Date: Apr. 6, 2006

(65) Prior Publication Data

US 2008/0278064 A1 Nov. 13, 2008

(30) Foreign Application Priority Data

Sep. 30, 2004 (JP) .............................. 2004-288972

(51) Int. Cl.
*H01J 1/62* (2006.01)
(52) U.S. Cl. ...................................... 313/504; 428/690
(58) Field of Classification Search ......... 313/504–512; 428/690
See application file for complete search history.

(56) References Cited

U.S. PATENT DOCUMENTS 5,989,737 A 11/1999 Xie et al.

(Continued)

FOREIGN PATENT DOCUMENTS

EP 0 855 848 A2 7/1998

(Continued)

OTHER PUBLICATIONS

Tang, C.W. et al, "Organic Electroluminescent Diodes," Appl. Phys. Lett., vol. 51, No. 12, pp. 913-915, Sep. 21, 1987.

(Continued)

*Primary Examiner*—Nimeshkumar D. Patel
*Assistant Examiner*—Mary Ellen Bowman
(74) *Attorney, Agent, or Firm*—Husch Blackwell Sanders LLP

(57) ABSTRACT

It is an object of the present invention to provide a light-emitting element having a structure in which the drive voltage is relatively low. Further, it is an object of the invention to provide a highly reliable light emitting device by alleviating the stress to the light emitting layer. Further, it is another object of the invention to provide a light emitting element having a structure in which increase in the drive voltage over time is small. It is an object of the present invention to provide a display device in which the drive voltage is low and increase in the drive voltage over time is small and which can withstand long-term use. In a light emitting element, a layer in contact with an electrode serves as a hole generating layer such as an organic compound layer containing a P-type semiconductor or an electron accepting material, a light emitting layer is provided between hole generating layers, an electron generating layer is formed between the hole generation layer on the cathode side and the light emitting layer.

28 Claims, 19 Drawing Sheets

U.S. PATENT DOCUMENTS

| | | | |
|---|---|---|---|
| 6,013,384 A | 1/2000 | Kido et al. | 428/690 |
| 6,172,459 B1 | 1/2001 | Hung et al. | |
| 6,249,085 B1 * | 6/2001 | Arai | 313/506 |
| 6,423,429 B2 | 7/2002 | Kido et al. | 428/690 |
| 6,483,236 B1 | 11/2002 | Hung | 313/506 |
| 6,486,601 B1 | 11/2002 | Sakai et al. | |
| 6,566,807 B1 | 5/2003 | Fujita et al. | |
| 6,573,650 B2 | 6/2003 | Aoki et al. | |
| 6,589,673 B1 | 7/2003 | Kido et al. | |
| 6,602,619 B2 | 8/2003 | Lin et al. | |
| 6,674,098 B1 | 1/2004 | Niki et al. | |
| 6,872,472 B2 | 3/2005 | Liao et al. | |
| 6,917,159 B2 | 7/2005 | Tyan et al. | |
| 7,141,817 B2 | 11/2006 | Nishi et al. | |
| 7,158,161 B2 | 1/2007 | Gyoutoku et al. | |
| 7,387,904 B2 | 6/2008 | Saito et al. | |
| 7,462,883 B2 | 12/2008 | Kumaki et al. | |
| 2003/0111666 A1 | 6/2003 | Nishi et al. | 257/79 |
| 2003/0189401 A1 * | 10/2003 | Kido et al. | 313/504 |
| 2004/0185299 A1 | 9/2004 | Ly | |
| 2004/0234814 A1 * | 11/2004 | Nakaya et al. | 428/690 |
| 2005/0067951 A1 | 3/2005 | Richter et al. | |
| 2005/0084712 A1 | 4/2005 | Kido et al. | |
| 2005/0084713 A1 | 4/2005 | Kido et al. | |
| 2005/0098207 A1 | 5/2005 | Matsumoto et al. | 136/263 |
| 2005/0106419 A1 | 5/2005 | Endoh et al. | |
| 2005/0170208 A1 | 8/2005 | Yatsunami et al. | |
| 2006/0008740 A1 | 1/2006 | Kido et al. | |
| 2006/0027830 A1 | 2/2006 | Kumaki et al. | 257/103 |
| 2007/0114527 A1 | 5/2007 | Kumaki et al. | |
| 2007/0182317 A1 | 8/2007 | Kido et al. | |
| 2007/0200125 A1 | 8/2007 | Ikeda et al. | |
| 2007/0221912 A1 | 9/2007 | Jeong et al. | |

FOREIGN PATENT DOCUMENTS

| | | |
|---|---|---|
| EP | 0 948 063 A2 | 10/1999 |
| EP | 1 160 891 A2 | 12/2001 |
| EP | 1 351 558 A1 | 10/2003 |
| EP | 1 530 245 A2 | 5/2005 |
| JP | 2-288092 | 11/1990 |
| JP | 3-274695 | 12/1991 |
| JP | 06-267658 | 9/1994 |
| JP | 9-63771 | 3/1997 |
| JP | 10-270171 | 10/1998 |
| JP | 11-251067 | 9/1999 |
| JP | 11-297474 | 10/1999 |
| JP | 11-307259 | 11/1999 |
| JP | 11-307264 | 11/1999 |
| JP | 2000-315580 | 11/2000 |
| JP | 2002-015873 | 1/2002 |
| JP | 2003-229278 | 8/2003 |
| JP | 2003-0272860 | 9/2003 |
| JP | 2005-26121 | 1/2005 |
| JP | 2005-166637 | 6/2005 |
| JP | 2005-251587 | 9/2005 |

OTHER PUBLICATIONS

Tokito, S. et al, "Metal Oxides as a Hole-Injecting Layer for an Organic Electroluminescent Device," J. Phys. D. Appl. Phys., vol. 29, pp. 2750-2753, (1996).

International Search Report re application No. PCT/JP2005/018226, dated Nov. 15, 2005.

Written Opinion re application No. PCT/JP2005/018226, dated Nov. 15, 2005.

* cited by examiner

LIGHT EMITTING ELEMENT

TECHNICAL FIELD

The present invention relates to a light-emitting element in which a thin film containing a light-emitting material is interposed between electrodes and which emits light when current is applied. Moreover, the present invention relates to a display device and an electronic appliance which use the light-emitting element.

BACKGROUND ART

A display using a thin film light-emitting element of a self-light-emitting type, which emits light by itself when current is applied, has been extensively developed.

Such a thin film light-emitting element emits light by connecting an electrode to a single-layer or multilayer thin film formed using one or both of an organic compound and an inorganic compound when current is applied. Such a thin film light-emitting element is expected to reduce the power consumption, occupy smaller space, and increase the visibility, and the market is also expected to expand further.

It has become possible to manufacture an element which emits light more efficiently than before by dividing the function for each layer of a light-emitting element having a multilayer structure (for example, see Reference 1: Applied Physics Letters, Vol. 51, No. 12, 913-915 (1987) by C. W. Tang et al.).

A thin film light-emitting element having a multilayer structure has a light-emitting stack provided between an anode and a cathode. The light-emitting stack includes a hole-injecting layer, a hole-transporting layer, a light-emitting layer, an electron-transporting layer, an electron-injecting layer, and the like. Among these layers, all the hole-injecting layer, the hole-transporting layer, the electron-transporting layer, and the electron-injecting layer may not necessarily be used depending on the element structure.

The hole-injecting layer in the light-emitting stack as above is formed with a material which can inject holes relatively easily from a metal electrode into a layer mainly containing an organic compound. The electron-transporting layer in the light-emitting stack is formed with a material that is superior in electron-transporting properties. Thus, each layer in the light-emitting stack is formed by selecting a material superior in each function.

However, a material mainly containing an organic compound, to which electrons can be injected relatively easily from an electrode, or a material mainly containing an organic compound which can transport electrons at a predetermined mobility or more is very limited. As is clear from the limitation on the material, the injection of the electrons from the electrode into the layer mainly containing the organic compound is originally rare to occur. Thus, the drive voltage is high. Further, an experiment shows that an element of higher drive voltage has higher drive voltage over time.

DISCLOSURE OF INVENTION

Consequently, it is an object of the present invention to provide a light-emitting element having a structure in which the drive voltage is relatively low. Further, it is another object of the invention to provide a light emitting element having a structure in which increase in the drive voltage over time is small.

Further, it is an object of the present invention to provide a display device in which the drive voltage is low and increase in the drive voltage over time is small and which can withstand long-term use.

Further, it is also an object of the present invention to improve the reliability of a light emitting element.

According to the present invention, a layer in contact with either of electrodes (a first electrode, a second electrode) in a light-emitting element is a hole-generating layer such as a layer containing a P-type semiconductor or an organic compound layer containing a material having electron-accepting properties, a light-emitting layer is provided between the hole-generating layers, and an electron-generating layer is formed between the hole-generating layer on the second electrode side and the light-emitting layer. This makes it possible to suppress the drive voltage. Further, increase in the drive voltage over time can be suppressed due to the lower drive voltage.

A light emitting element of one aspect of the structure of the present invention is provided with a first electrode and a second electrode; a first layer and a second layer each containing an organic material and an inorganic material; a third layer containing a light emitting material; and a fourth layer generating electrons. The first layer is in contact with the first electrode, the second layer is in contact with the second electrode, the third layer is provided between the first electrode and the second electrode with the first layer and the second layer respectively therebetween, and the fourth layer is provided between the third layer and the second layer.

A light emitting element having a structure of another aspect of the present invention is provided with a first electrode and a second electrode; a first layer and a second layer each generating holes; a third layer containing a light emitting material; and a fourth layer generating electrons. The first layer is in contact with the first electrode, the second layer is in contact with the second electrode, the third layer is provided between the first electrode and the second electrode with the first layer and the second layer respectively therebetween, and the fourth layer is provided between the third layer and the second layer.

A light emitting element having a structure of another aspect of the present invention is provided with a first electrode and a second electrode; a first layer and a second layer each containing a P-type semiconductor; a third layer containing a light emitting material; and a fourth layer containing an N-type semiconductor. The first layer is in contact with the first electrode, the second layer is in contact with the second electrode, the third layer is provided between the first electrode and the second electrode with the first layer and the second layer respectively therebetween, and the fourth layer is provided between the third layer and the second layer.

A light emitting element having a structure of another aspect of the present invention is provided with a first electrode and a second electrode; a first layer and a second layer each containing a first organic compound and a material which accepts electrons of the first organic compound; a third layer containing a light emitting material; and a fourth layer containing a second organic compound and a material which donates electrons to the second organic compound. The first layer is in contact with the first electrode, the second layer is in contact with the second electrode, the third layer is provided between the first electrode and the second electrode with the first layer and the second layer respectively therebetween, and the fourth layer is provided between the third layer and the second layer.

Further, in the above structure of a light emitting element according to the invention, the difference between the molar ratio of the electron accepting material to a first organic compound in the second layer and the molar ratio of the electron accepting material to the first organic compound in the first layer is preferably in the range of 80% of the molar ratio of the electron accepting material to the first organic compound in the second layer and also in the range of 80% of the molar ratio of the electron accepting material to the first organic compound in the first layer. More preferably, the difference between the molar ratio of the electron accepting material to the first organic compound in the second layer and the molar ratio of the electron accepting material to the first organic compound in the first layer is in the range of 40% of the molar ratio of the electron accepting material to the first organic compound in the second layer and also in the range of 40% of the molar ratio of the electron accepting material to the first organic compound in the first layer.

Further, in the above structure of a light emitting element according to the invention, the thickness of each of the first layer and the second layer is 30 nm to 1 µm.

Further, in the above structure of a light emitting element according to the invention, the thickness of the second layer is 50% to 150% of the thickness of the first layer, and the thickness of the first layer is 50% to 150% of the thickness of the second layer.

In a light-emitting element having a structure according to the present invention, the drive voltage can be lowered. Further, increase in the drive voltage over time can be suppressed due to the lower drive voltage.

Further, a display device in which the drive voltage and increase in the drive voltage over time is small and which can withstand long-term use can be provided.

Still further, the stress in the light emitting layer can be alleviated. Accordingly, the reliability of the light emitting element can be improved.

BEST MODE FOR CARRYING OUT THE INVENTION

Embodiment Modes and Embodiments will be hereinafter described with reference to the drawings. However, since the present invention can be carried out in many different modes, it is to be understood by those skilled in the art that the modes and details can be modified without departing from the scope of the present invention. Therefore, the present invention is not construed as being limited to the description of the following Embodiment Modes and Embodiments.

Embodiment Mode 1

Figure 1:
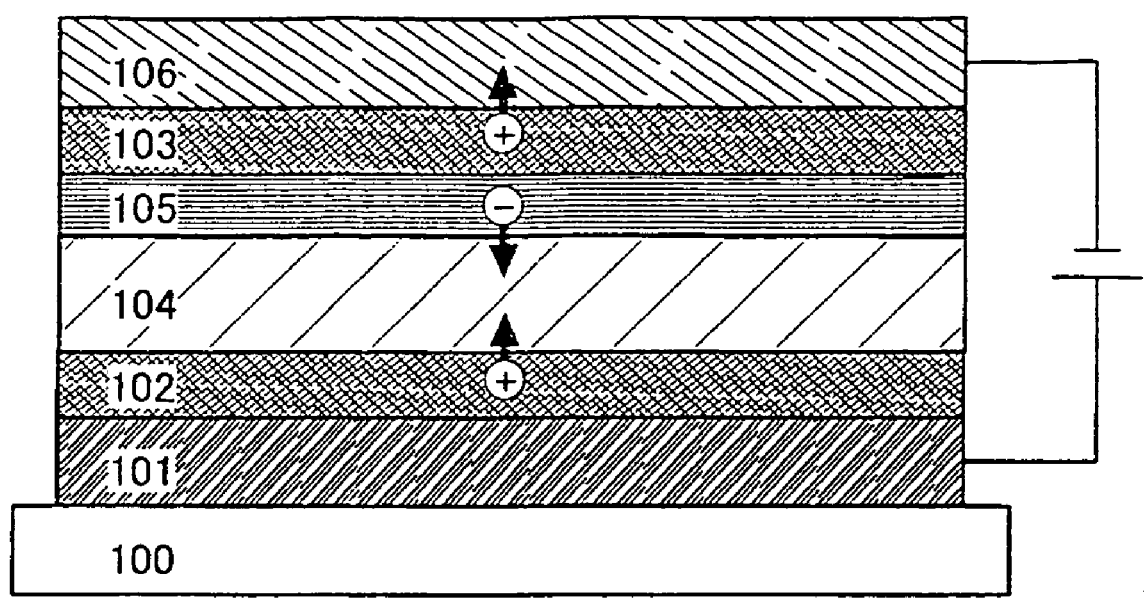
FIG. 1 shows a light-emitting element according to the present invention.
Figure 2:
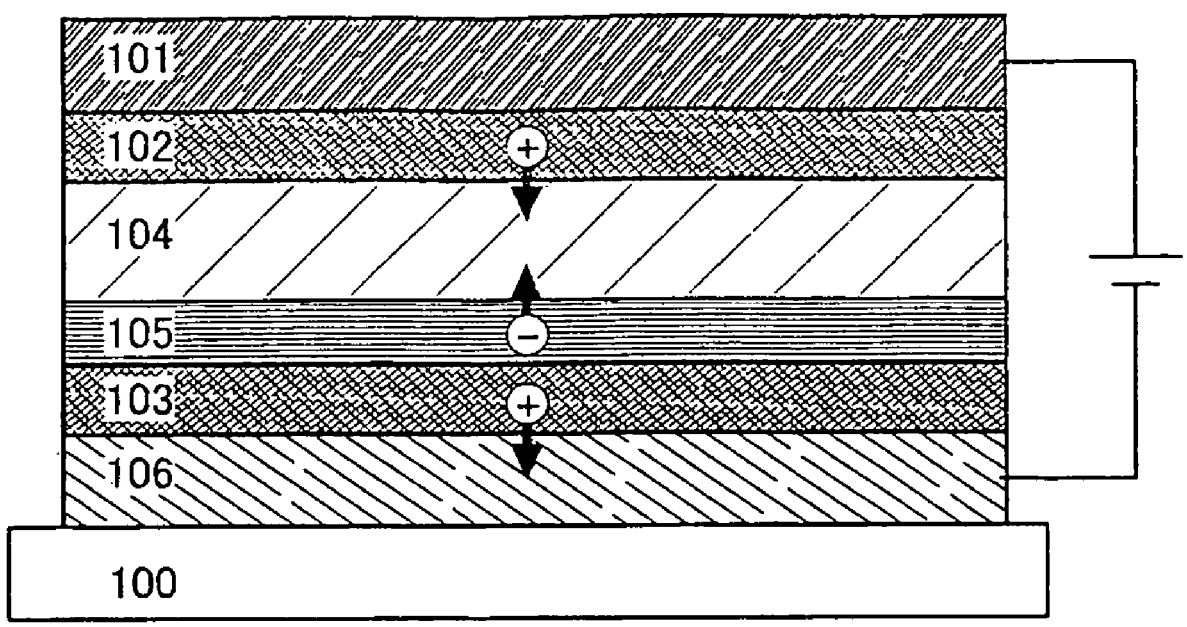
FIG. 2 shows a light-emitting element according to the present invention.

In the present embodiment mode, structures of a light-emitting element of the present invention will be described with reference to FIGS. 1 and 2. In a light-emitting element according to the present invention, a light-emitting layer 104 containing a light-emitting material and an electron-generating layer 105 are stacked, and the light-emitting layer 104 and the electron-generating layer 105 are provided between a first hole-generating layer 102 and a second hole-generating layer 103. The first hole generating layer 102 is in contact with a first electrode, and the second hole generating layer 103 is in contact with a second electrode. The first hole-generating layer 102 and the second hole-generating layer 103 are further provided between the first electrode 101 and the second electrode 106, and stacked over an insulator 100 such as a substrate or an insulating film. Over the insulator 100 such as the substrate or the insulating film, the first electrode 101, the first hole-generating layer 102, the light-emitting layer 104, the electron-generating layer 105, the second hole-generating layer 103, and the second electrode 106 are stacked in order (FIG. 1). Alternatively, the order may be opposite: the second electrode 106, the second hole-generating layer 103, the electron-generating layer 105, the light-emitting layer 104, the first hole-generating layer 102, and the first electrode 101 are stacked in order (FIG. 2). Note that, in this embodiment mode, when voltage is applied so as to make a light emitting element emit light, the electrode applied with higher potential is the first electrode, and the electrode applied with lower potential is the second electrode.

The first hole-generating layer 102 and the second hole-generating layer 103 are each formed with the same material using a layer containing both of a hole-transporting material and an electron-accepting material which can receive electrons from the hole-transporting material, a P-type semiconductor layer, or a layer containing a P-type semiconductor is used. The thickness of the first hole-generating layer 102 and the second hole-generating layer 103 is preferably 30 nm to 1 µm. Further, it is preferable that the thicknesses of the first hole-generating layer 102 and the second hole-generating layer 103 be almost the same. The thickness of the second hole-generating layer is not to be thicker or thinner than the first hole-generating layer by more than 50%. Meanwhile, the thickness of the first hole-generating layer is not to be thicker or thinner than the second hole-generating layer by more than 50%. In other words, the thickness of the second hole generating layer is 50% to 150% of the thickness of the first hole generating layer while the thickness of the first hole generating layer is 50% to 150% of the second hole generating layer. Letting X denote the thickness of the first hole generating layer and Y denote the thickness of the second hole generating layer, $0.5 \leq (Y/X) \leq 1.5$ and $0.5 \leq (X/Y) \leq 1.5$ are satisfied.

Further, the first hole generating layer 102 and the second hole generating layer 103 are preferably formed with the same materials using a hole transporting material and an electron accepting material which can receive electrons from the hole transporting material. The difference between the molar ratio of the electron accepting material to the hole transporting material in the second hole generating layer and the molar ratio of the electron accepting material to the hole transporting material in the first hole generating layer is preferably in the range of 80% of the molar ratio of the electron accepting material to the hole transporting material in the second hole generating layer and also in the range of 80% of the molar ratio of the electron accepting material to the hole transporting material in the first hole generating layer. More preferably, the difference between the molar ratio of the electron accepting material to the hole transporting material in the second hole generating layer and the molar ratio of the electron accepting material to the hole transporting material in the first hole generating layer is in the range of 40% of the molar ratio of the electron accepting material to the hole transporting material in the second hole generating layer and also in the range of 40% of the molar ratio of the electron accepting material to the hole transporting material in the first hole generating layer.

Accordingly, letting A denote the molar ratio of the electron accepting material to the hole transporting material in the first hole generating layer, and B denote the molar ratio of the electron accepting material to the hole transporting material in the second hole generating layer; $(-0.8 \times A) \leq B - A \leq (0.8 \times A)$ and $(-0.8 \times B) \leq B - A \leq (0.8 \times B)$ are to be satisfied.

As the hole-transporting material, for example, an aromatic amine compound (having a bond of a benzene ring with nitrogen), phthalocyanine (abbreviated to $H_2Pc$), or a phthalocyanine compound such as copper phthalocyanine (abbreviated to CuPc) or vanadyl phthalocyanine (abbreviated to VOPc) can be used. The aromatic amine compound is, for example, 4,4'-bis[N-(1-naphthyl)-N-phenyl-amino]-biphenyl (abbreviated to α-NPD), 4,4'-bis[N-(3-methylphenyl)-N-phenyl-amino]-biphenyl (abbreviated to TPD), 4,4',4''-tris(N,N-diphenyl-amino)-triphenylamine (abbreviated to TDATA), 4,4',4''-tris[N-(3-methylphenyl)-N-phenyl-amino]-triphenylamine (abbreviated to MTDATA), or 4,4'-bis(N-(4-(N,N-di-m-tolylamino)phenyl)-N-phenylamino)biphenyl (abbreviated to DNTPD). As the electron-accepting material which can receive electrons from the hole-transporting material, for example, molybdenum oxide (MoOx), vanadium oxide, 7,7,8,8,-tetracyanoquinodimethane (abbreviated to TCNQ), 2,3-dicyanonaphtoquinone (abbreviated to DCNNQ), 2,3,5,6-tetrafluoro-7,7,8,8,-tetracyanoquinodimethane (abbreviated to F4-TCNQ), or the like is used. The electron-accepting material which can receive electrons is selected in accordance with the combination with the hole-transporting material. Further, metal oxide such as molybdenum oxide (MoOx), vanadium oxide, ruthenium oxide, cobalt oxide, nickel oxide, or copper oxide can be used as the P-type semiconductor.

Further, instead of the first hole generating layer 102 and the second hole generating layer 103, a first layer and a second layer, each of which is formed with a layer containing an organic compound such as the above described hole transporting material and an inorganic material or two or more inorganic materials selected from zinc oxide, indium oxide, tin oxide, antimony oxide, tungsten oxide, indium nitride, tin nitride, antimony nitride, a tungsten nitride, and molybdenum nitride. The thickness of the first layer and the second layer is preferably 30 nm to 1 μm. Further, the thicknesses of the first layer and the second layer are preferably almost the same, and the thickness of the second layer is not to be thicker or thinner than that of the first layer by more than 50%. Meanwhile, the thickness of the first layer is not to be thicker or thinner than that of the second layer by more than 50%. In other words, the thickness of the second layer is 50% to 150% of the thickness of the first layer, and the thickness of the first layer is 50% to 150% of the thickness of the second layer. Further, the first layer and the second layer are preferably formed with respective layers containing the same hole transporting material and the same inorganic material. The difference between the molar ratio of the electron accepting material to a first organic compound in the second layer and the molar ratio of the electron accepting material to the first organic compound in the first layer is preferably in the range of 80% of the molar ratio of the electron accepting material to the first organic compound in the second layer and also in the range of 80% of the molar ratio of the electron accepting material to the first organic compound in the first layer. More preferably, the difference between the molar ratio of the electron accepting material to the first organic compound in the second layer and the molar ratio of the electron accepting material to the first organic compound in the first layer is in the range of 40% of the molar ratio of the electron accepting material to the first organic compound in the second layer and also in the range of 40% of the molar ratio of the electron accepting material to the first organic compound in the first layer.

As the electron-generating layer 105, a layer containing both of an electron-transporting material and an electron donating material which can donate electrons to the electron-transporting material, an N-type semiconductor layer, or a layer containing an N-type semiconductor can be used. As the electron-transporting material, for example, the following can be used; a metal complex having a quinoline skeleton or a benzoquinoline skeleton such as tris-(8-quinolinolato)aluminum (abbreviated to $Alq_3$), tris(4-methyl-8-quinolinolato) aluminum (abbreviated to $Almq_3$), bis(10-hydroxybenzo[h]-quinolinolato)beryllium (abbreviated to $BeBq_2$), or bis(2-methyl-8-quinolinolato)-4-phenylphenolato-aluminum (abbreviated to BAlq). Besides, a metal complex having an oxazole or thiazole ligand such as bis[2-(2-hydroxyphenyl) benzoxazolate]zinc (abbreviated to $Zn(BOX)_2$) or bis[2-(2-hydroxyphenyl)benzothiazolate]zinc (abbreviated to $Zn(BTZ)_2$) can be used. In addition to the metal complex, 2-(4-biphenylyl)-5-(4-tert-butylphenyl)-1,3,4-oxadiazole (abbreviated to PBD), 1,3-bis[5-(p-tert-butylphenyl)-1,3,4-oxadiazole-2-yl]benzene (abbreviated to OXD-7), 3-(4-tert-butylphenyl)-4-phenyl-5-(4-biphenylyl)-1,2,4-triazole (abbreviated to TAZ), 3-(4-tert-butylphenyl)-4-(4-ethylphenyl)-5-(4-biphenylyl)-1,2,4-triazole (abbreviated to p-EtTAZ), bathophenanthroline (abbreviated to BPhen), bathocuproin (abbreviated to BCP), or the like can be used. As the electron donating material which can donate electrons to the electron-transporting material, for example, alkali metal such as lithium or cesium, magnesium, alkali-earth metal such as calcium, or rare-earth metal such as erbium or ytterbium can be used. The electron donating material which can donate electrons is selected in accordance with the combination with the electron-transporting material. Further, a metal compound such as metal oxide can be used as the N-type semiconductor, and for example zinc oxide, zinc sulfide, zinc selenide, titanium oxide, or the like can be used.

The light-emitting layer 104 containing the light-emitting material is divided into two types. One of them is a layer in which a light-emitting material to be a luminescence center is diffused in a layer formed with a material having a wider energy gap than the light-emitting material. The other one is a layer consisting of a light-emitting material. The former structure is preferred because the concentration quenching is difficult to occur. As the light-emitting material to be the luminescence center, the following can be employed; 4-dicyanomethylene-2-methyl-6-[-2-(1,1,7,7-tetramethyl-9-julolidyl)ethenyl)-4H-pyran (abbreviation: DCJT); 4-dicyanomethylene-2-t-butyl-6-[2-(1,1,7,7-tetramethyl-julolidine-9-yl)ethenyl]-4H-pyran; periflanthene; 2,5-dicyano-1,4-bis[2-(10-methoxy-1,1,7,7-tetramethyl-julolidine-9-yl)ethenyl]benzene, N,N'-dimethylquinacridone (abbreviated to DMQd), coumarin 6, coumarin 545T, tris (8-quinolinolato) aluminum (abbreviated to $Alq_3$), 9,9'-bianthryl, 9,10-diphenylanthracene (abbreviated to DPA), 9,10-bis(2-naphthyl)anthracene (abbreviated to DNA), 2,5,8,11-tetra-t-butylperylene (abbreviated to TBP), or the like. As the material to be a base material in the case of forming the layer in which the light-emitting material is diffused, the following can be used; an anthracene derivative such as 9,10-di(2-naphtyl)-2-tert-butylanthracene (abbreviated to t-BuDNA), a carbazole derivative such as 4,4'-bis(N-carbazolyl)biphenyl (abbreviated to CBP), or a metal complex such as tris(8-quinolinolato)aluminum (abbreviated to $Alq_3$), tris(4-methyl-8-quinolinolato)aluminum (abbreviated to $Almq_3$), bis(10-hydroxybenzo[h]-quinolinato)beryllium (abbreviated to $BeBq_2$), bis(2-methyl-8-quinolinolato)-4-phenylphenolato-aluminum (abbreviated to BAlq), bis[2-(2-hydroxyphenyl)pyridinato]zinc (abbreviated to $Znpp_2$), or bis[2-(2-hydroxyphenyl)benzoxazolate]zinc (abbreviated to ZnBOX). As the material which can singly constitute the light-emitting layer 104, tris(8-quinolinolato)aluminum (abbreviated to $Alq_3$), 9,10-bis(2-naphtyl)anthracene (abbreviated to DNA), or bis(2-methyl-8-quinolinolato)-4-phenylphenolato-aluminum (abbreviated to BAlq) or the like can be used.

The light-emitting layer 104 may be formed either in a single-layer structure or a multilayer structure. A hole-transporting layer may be provided between the first hole-generating layer 102 and the layer in which the light-emitting material of the light-emitting layer 104 is diffused. Further, an electron-transporting layer may be provided between the electron-generating layer 105 and the layer in which the light-emitting material of the light-emitting layer 104 is diffused. These layers are not necessarily provided. Alternatively, only one of the hole-transporting layer and the electron-transporting layer may be provided. The materials of the hole-transporting layer and the electron-transporting layer conform to those of the hole-transporting layer in the hole-generating layer and the electron-transporting layer in the electron-generating layer respectively; therefore, the description is omitted here. Refer to the description of those layers.

The first electrode 101 is preferably formed of metal, an alloy, an electrically conductive compound each of which has high work function (work function of 4.0 eV or more), or a mixture thereof. As a specific example of the first electrode material, the following can be used: ITO (indium tin oxide), ITO containing silicon, IZO (indium zinc oxide) in which zinc oxide (ZnO) is mixed by 2 to 20% into indium oxide, gold (Au), platinum (Pt), nickel (Ni), tungsten (W), chromium (Cr), molybdenum (Mo), iron (Fe), cobalt (Co), copper (Cu), palladium (Pd), or metal nitride such as TiN. Meanwhile, as the second electrode material used for forming the second electrode 106, it is preferable to use metal, alloy, an electrically conductive compound each of which has low work function (work function of 3.8 eV or less), or a mixture thereof. As the specific example of the second electrode material, the following can be used; an element belonging to group 1 or 2 in the periodic table; alkali metal such as Li or Cs or alkali-earth metal such as Mg, Ca or Sr. In addition, alloy containing the above element such as Mg:Ag or Al:Li, a compound containing the above element such as LiF, CsF, or $CaF_2$, or transition metal containing rare-earth metal can also be used. Further, a stack of the above element and another metal (including an alloy) such as Al, Ag, or ITO can be used.

Figure 3:
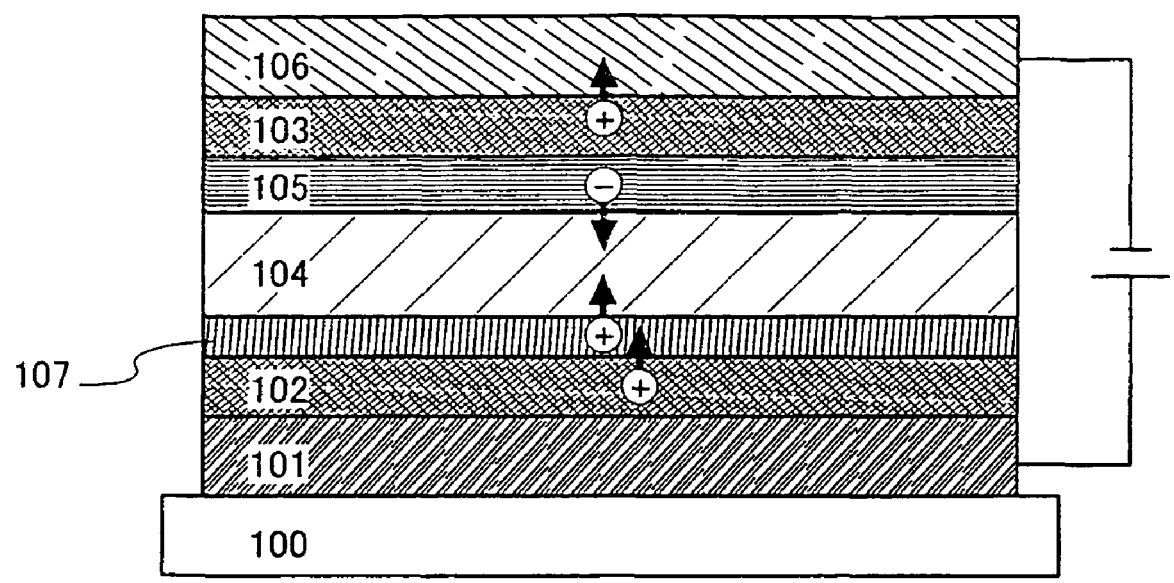
FIG. 3 shows a light-emitting element according to the present invention.
Figure 4:
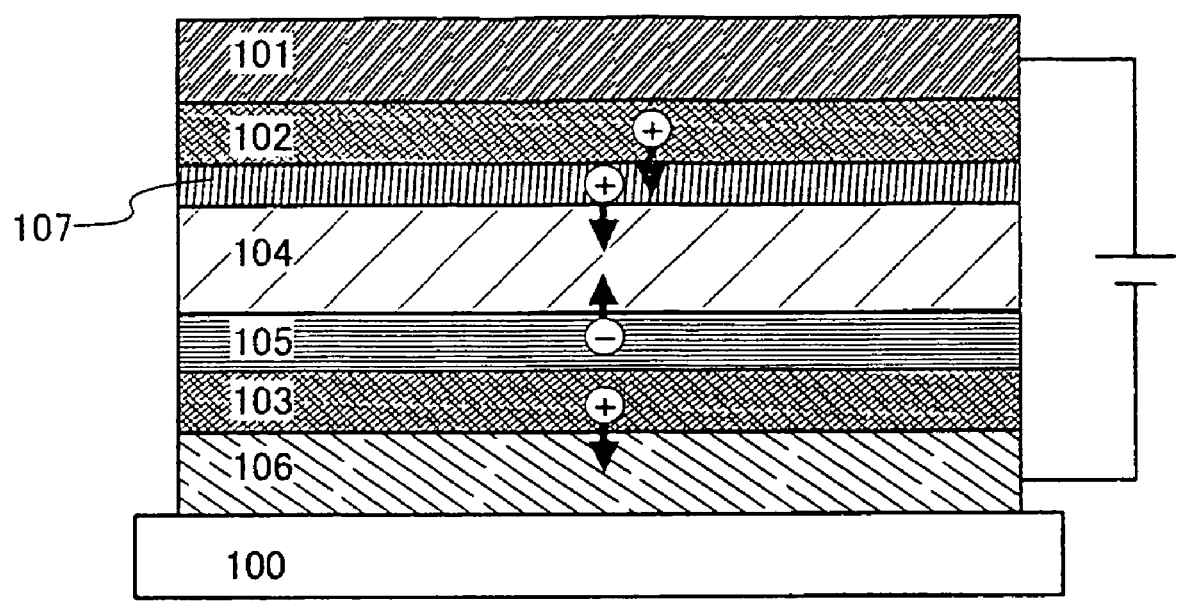
FIG. 4 shows a light-emitting element according to the present invention.

In addition to the first electrode 101, the first hole-generating layer 102, the light-emitting layer 104, the electron-generating layer 105, the second hole-generating layer 103, and the second electrode 106; the light-emitting layer may have a third hole-injecting layer 107 between the first hole-generating layer 102 and the light-emitting layer 104 (FIGS. 3 and 4). In this case, the third hole generating layer 107 is desirably formed with a material different from that of the first hole generating layer 102, the first hole generating layer 102 is formed with the same material as the second hole generating layer 103. Further, the thickness of the second hole generating layer 103 is not to be thicker or thinner than that of the first hole generating layer 102 by more than 50%. Meanwhile, the thickness of the first hole generating layer 102 is not to be thicker or thinner than that of the second hole generating layer 103 by more than 50%. In other words, the thicknesses of the first hole generating layer 102 and the second hole generating layer 103 are to be almost the same.

The above material is just an example, and the material can be selected appropriately by a practitioner as long as the advantage of the present invention is obtained.

In the light-emitting element having the above structure according to the present invention, holes are injected from the second hole-generating layer 103 into the second electrode when voltage is applied. In addition, electrons are injected from the electron-generating layer 105 into the light-emitting layer 104. Further, holes are injected from the first hole-generating layer 102 into the light-emitting layer 104. Then, the injected electrons and holes are recombined in the light-emitting layer, and luminescence can be obtained when the excited light-emitting material returns to the ground state. Here, in the light-emitting element according to the present invention, the electrons are not injected from the electrode into the layer mainly containing the organic compound but injected from the layer mainly containing the organic compound into the other layer mainly containing the organic compound. The electrons are difficult to be injected from the electrode into the layer mainly containing the organic compound. Accordingly, in the conventional light-emitting element, the drive voltage has increased when the electrons are injected from the electrode into the layer mainly containing the organic compound. However, since the light-emitting element according to the present invention is manufactured without such a process, the light-emitting element with low drive voltage can be provided. Moreover, it is already known from the experiment that the drive voltage increases over time more drastically when the light-emitting element has higher drive voltage; therefore, the light-emitting element according to the invention with low drive voltage is also a light-emitting element in which the increase in the drive voltage over time is small.

As to a light emitting element of the present invention, since the light emitting layer 104 is provided between the electrodes with layers having almost the same stress with the light emitting layer 104 and the electrodes, on the both sides; thus, the stress in the light emitting layer can be alleviated. Accordingly, the reliability of the light emitting element can be improved.

In particular, when a light emitting element has a structure in which layers in contact with the electrodes are hole generating layers, and the light emitting layer is provided between the electrodes, with the hole generating layers on both sides of the light emitting layer, for example, with the structure in which a hole generating layer is over an electrode, a light emitting layer is provided thereover, another hole generating layer is provided thereover, and the other electrode is provided thereover; the stress on both sides of the light emitting layer is alleviated and the reliability of the light emitting element is improved. Incidentally, a hole generating layer is a layer which contains an organic material and a metal oxide. For example, a layer containing the above hole transporting material and a molybdenum oxide (MoOx), a zinc oxide, or an indium oxide; or a layer containing the above hole transporting material and two or more metal oxides selected from a molybdenum oxide (MoOx), a zinc oxide, and an indium oxide is preferable. Note that another layer may be provided between the hole generating layer and the light emitting layer.

Embodiment Mode 2

Another embodiment mode of the present invention will be described. The present embodiment mode describes an example of improving the characteristic of a viewing angle of a light-emitting element and a display device by appropriately adjusting the thicknesses of the first hole-generating layer 102 and the second hole-generating layer 103. Since the layered structure and the material of the light-emitting element in the present embodiment mode are the same as those in Embodiment Mode 1, the description is omitted here. Refer to Embodiment Mode 1. Note that, also in the present embodiment mode, when voltage is applied so as to make a light emitting element emit light, the electrode applied with higher potential is the first electrode, and the electrode applied with lower potential is the second electrode.

Light emitted from the light-emitting element includes light directly emitted from the light-emitting layer 104 and light emitted after being reflected once or multiple times. The light directly emitted and the light emitted after being reflected interfere in accordance with the relation between their phases so that they are intensified or attenuated with each other. Therefore, the light emitted from the light-emitting element is light which has been combined as a result of the interference.

The phase of light reflected when entering a medium having high refractive index from a medium having low refractive index is inverted. For this reason, in the light-emitting element having the structure shown in Embodiment Mode 1, the phase of light is inverted when the light is reflected at the interface between the electrode such as the first electrode 101 or the second electrode 106 and the layer in contact with the electrodes. When the light reflected at the electrode interferes with the light emitted from the light-emitting layer, in the case where the optical distance (refractive index×physical distance) between the light-emitting layer and the electrode satisfies $(2m-1)\lambda/4$ (m is a natural number of 1 or more and $\lambda$ is a center wavelength of the light emitted from the light-emitting layer), it is possible to decrease the change of the spectrum shape which occurs depending on the angle of viewing a surface from which light is extracted and to increase the current efficiency of the light-emitting element. The current efficiency shows the luminance with respect to the flowed current. When the current efficiency is higher, predetermined luminance can be obtained even with a smaller amount of current. Moreover, the deterioration of the element tends to be little.

Since the reflection is small between films having small refractive index difference, the reflections except the reflection at the interface between the electrode and the film in contact with the electrode are ignorable. Therefore, in this embodiment mode, attention is paid only to the reflection between the electrode and the film in contact with the electrode.

In the case of a light-emitting element in which light is extracted from the side of the first electrode 101, the light is reflected at the second electrode 106. For this reason, in order to increase the current efficiency of the light-emitting element and to decrease the change of the spectrum shape which occurs depending on the angle of viewing the surface from which the light is extracted, the optical distance (refractive index×physical distance) from the light-emission position to the surface of the second electrode 106 may be $(2m-1)\lambda/4$ (m is a natural number of 1 or more and $\lambda$ is a center wavelength of the light emitted from the light-emitting layer).

The light-emitting layer 104 may be formed in a single-layer structure with a layer containing a light-emitting material, or may be formed in a multilayer structure including layers such as an electron-transporting layer or a hole-transporting layer and a layer containing a light-emitting material. The layer containing the light-emitting material may be a layer in which a light-emitting material to be a luminescence center is diffused or may be a layer consisting of a light-emitting material.

A plurality of layers formed with different materials is provided between the light-emission position and the second electrode 106. In this embodiment mode, the plurality of layers correspond to the electron-generating layer 105 and the second hole-generating layer 103. A half of the layer containing the light-emitting material, having half the thickness thereof can be regarded as a layer positioned between the light-emission position and the second electrode 106. In the case of forming the light-emitting layer with a plurality of layers, more layers formed with different materials may be included. In such a structure, the optical distance between the light-emission position and the second electrode 106 can be calculated by multiplying the thicknesses and the refractive indexes of the respective films and summing up the products. The total is set so as to be $(2m-1)\lambda/4$ (m is a natural number of 1 or more and $\lambda$ is a center wavelength of the light emitted from the light-emitting layer). That is to say, the following formula (1) is satisfied. In the formula (1), the layer containing the light-emitting material is assumed to be 1 and the second electrode 106 is assumed to be j (j is an integer number of 4 or more), and the layers existing between the layer containing the light-emitting material and the second electrode 106 are denoted with numerals in order from the layer containing the light-emitting material. Moreover, the refractive index n and the thickness d with a certain numeral given thereto indicate the refractive index and the thickness of the layer to which the same numeral is given (that is, $n_1$ is the refractive index of the layer containing the light-emitting material and $d_j$ is the thickness of the second electrode).

$$\sum_{k=2}^{j-1} n_k d_k \leq \frac{(2m-1)\lambda}{4} \leq n_1 d_1 + \sum_{k=2}^{j-1} n_k d_k \quad \text{(Formula 1)}$$

Here, it is necessary to control the film thickness in order to satisfy the formula (1). Since the layer mainly containing the organic compound has low electron mobility, the drive voltage increases when the electron-generating layer 105 containing the electron-transporting material in which electrons serve as carriers is thick. Consequently, in this embodiment mode, the thickness of the second hole-generating layer 103 in which the mobility is relatively high in the layer mainly containing the organic compound is controlled, whereby the formula (1) is satisfied without drastically increasing the drive voltage.

In the case of a light-emitting element in which light is extracted from the side of the second electrode 106, the light is reflected at the first electrode 101. Therefore, in order to increase the current efficiency of the light-emitting element and to decrease the change of the spectrum shape which occurs depending on the angle of viewing the surface from which the light is extracted, the optical distance (refractive index×physical distance) from the light-emission position to the surface of the first electrode 101 may be set to $(2m-1)\lambda/4$ (m is a natural number of 1 or more and $\lambda$ is a center wavelength of the light emitted from the light emitting layer.)

The light-emitting layer 104 may be formed with a single-layer of the layer containing the light-emitting material or in a multilayer structure including the layer containing the light-emitting material and the layers such as the electron-transporting layer or the hole-transporting layer. The layer containing the light-emitting material may be a layer in which the light-emitting material to be the light-emission center is diffused, or a layer consisting of the light-emitting material. In any one of the above-mentioned structures, the layer containing the light-emitting material has a certain degree of thickness and an infinite number of the luminescence centers exist; therefore, it is impossible to determine the exact position where the light emission occurs. Accordingly, in this embodiment mode, a position of a half of the film containing the light-emitting material, having half the thickness thereof is regarded as the position where the light-emission occurs.

One or a plurality of layers is provided between the position where the light-emission occurs and the first electrode 101. In this embodiment mode, the layer corresponds to the first hole-generating layer 102. Further, a half of the layer containing the light-emitting material, having half the thickness thereof may be the layer located between the position where the light-emission occurs and the first electrode 101. Moreover, more layers may be included in the case where the light-emitting layer is formed with a plurality of layers. In such a structure, the optical distance from the light-emission position to the first electrode 101 can be calculated by multiplying the thicknesses and the refractive indexes of the respective films and summing up the products. That is to say, the following formula (2) is satisfied. In the formula (2), the layer containing the light-emitting material is assumed to be 1 and the first electrode 101 is assumed to be j (j is an integer number of 4 or more), and the layers existing between the layer containing the light-emitting material and the first electrode 101 are denoted with numerals in order from the layer containing the light-emitting material. Moreover, the refractive index n and the thickness d with a certain numeral given thereto indicate the refractive index and the thickness of the layer to which the same numeral is given (that is, $n_1$ is the refractive index of the layer containing the light-emitting material and $d_j$ is the thickness of the first electrode).

$$\sum_{k=2}^{j-1} n_k d_k \leq \frac{(2m-1)\lambda}{4} \leq n_1 d_1 + \sum_{k=2}^{j-1} n_k d_k \qquad \text{(Formula 2)}$$

Here, it is necessary to control the film thickness in order to satisfy the formula (2). In this embodiment mode, the formula (2) can be satisfied without drastically increasing the drive voltage, by controlling the thickness of the first hole-generating layer 102 in which the mobility is relatively high in the layer mainly containing the organic compound.

In the case of the structure in which light is extracted from both of the first electrode 101 and the second electrode 106, both of the formulas (1) and (2) may be satisfied.

With the structure of the light-emitting element shown in this embodiment mode, it is possible to provide a light-emitting element in which the change of the light-emission spectrum which occurs depending on the angle of viewing the surface from which the light is extracted is decreased.

The present embodiment mode can be combined with Embodiment Mode 1.

Embodiment Mode 3

This embodiment mode will describe a display device according to the present invention shown in Embodiment Mode 1 or Embodiment Mode 2 while showing its manufacturing method with reference to FIGS. 5A to 6C. Although this embodiment mode shows an example of manufacturing an active matrix display device, a light-emitting element of the present invention is also applicable for a passive matrix display device.

Figure 5A:
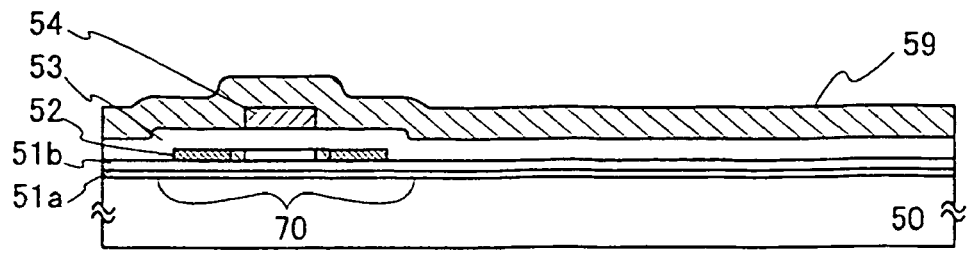
FIGS. 5A to 5E show a process for manufacturing a thin film light-emitting element according to the present invention.

First, a first base insulating layer 51a and a second base insulating layer 51b are formed over a substrate 50, and then a semiconductor layer is formed over the second base insulating layer 51b (FIG. 5A).

As a material of the substrate 50, glass, quartz, plastic (such as polyimide, acrylic, polyethylene terephthalate, polycarbonate, polyacrylate, or polyethersulfone), or the like can be used. These substrates may be used after being polished by CMP or the like as necessary. In this embodiment mode, a glass substrate is used.

The first base insulating layer 51a and the second base insulating layer 51b are provided in order to prevent an element which adversely affects the characteristic of the semiconductor film such as alkali metal or alkali-earth metal in the substrate 50 from diffusing into the semiconductor layer. As the material of these base insulating layers, silicon oxide, silicon nitride, silicon oxide containing nitrogen, silicon nitride containing oxygen, or the like can be used. In this embodiment mode, the first base insulating layer 51a is formed with silicon nitride, and the second base insulating layer 51b is formed with silicon oxide. Although the base insulating layer is formed in a two-layer structure including the first base insulating layer 51a and the second base insulating layer 51b in this embodiment mode, the base insulating layer may be formed in a single-layer structure or a multilayer structure including three or more layers. The base insulating layer is not necessary when the diffusion of the impurity from the substrate does not lead to a significant problem.

In this embodiment mode, the semiconductor layer formed subsequently is obtained by crystallizing an amorphous silicon film with a laser beam. The amorphous silicon film is formed to a thickness of 25 to 100 nm (preferably 30 to 60 nm) over the second base insulating layer 51b by a known method such as a sputtering method, a reduced-pressure CVD method, or a plasma CVD method. After that, heat treatment is conducted for one hour at 500° C. for dehydrogenation.

Next, the amorphous silicon film is crystallized with a laser irradiation apparatus to form a crystalline silicon film. In this embodiment mode, an excimer laser is used at the laser crystallization. After the emitted laser beam is shaped into a linear beam spot using an optical system, the amorphous silicon film is irradiated with the linear beam spot. Thus, the crystalline silicon film is formed which is to be used as the semiconductor layer.

Alternatively, the amorphous silicon film can be crystallized by another method such as a method in which the crystallization is conducted only by heat treatment or a method in which heat treatment is conducted using a catalyst element for inducing the crystallization. As the element for inducing the crystallization, nickel, iron, palladium, tin, lead, cobalt, platinum, copper, gold, or the like is given. By using such an element, the crystallization is conducted at lower temperature in shorter time than the crystallization only by the heat treatment; therefore, the damage to the glass substrate is suppressed. In the case of crystallizing only by the heat treatment, a quartz substrate which can resist the high temperature is preferably used as the substrate 50.

Subsequently, a small amount of impurity elements are added to the semiconductor layer as necessary in order to control the threshold, which is so-called channel doping. In order to obtain the required threshold, an impurity showing N-type or P-type (such as phosphorus or boron) is added by an ion-doping method or the like.

After that, as shown in FIG. 5A, the semiconductor layer is patterned into a predetermined shape so that an island-shaped semiconductor layer 52 is obtained. The patterning is conducted by etching the semiconductor layer using a mask. The mask is formed in such a way that a photo resist is applied to the semiconductor layer and the photo resist is exposed and baked so that a resist mask having a desired mask pattern is formed over the semiconductor layer.

Next, a gate insulating layer 53 is formed so as to cover the semiconductor layer 52. The gate insulating layer 53 is formed to a thickness of 40 to 150 nm with an insulating layer containing silicon by a plasma CVD method or a sputtering method. In this embodiment mode, silicon oxide is used.

Then, a gate electrode 54 is formed over the gate insulating layer 53. The gate electrode 54 may be formed with an element selected from the group consisting of tantalum, tungsten, titanium, molybdenum, aluminum, copper, chromium, and niobium, or may be formed with an alloy material or a compound material which contains the above element as its main component. Further, a semiconductor film typified by a poly-crystalline silicon film doped with an impurity element such as phosphorus may be used. Ag—Pd—Cu alloy may also be used.

Although the gate electrode 54 is formed with a single layer in this embodiment mode, the gate electrode 54 may have a multilayer structure including two or more layers of, for example, tungsten as a lower layer and molybdenum as an upper layer. Even in the case of forming the gate electrode in the multilayer structure, the above-mentioned material is preferably used. The combination of the above materials may also be selected appropriately. The gate electrode 54 is processed by etching with the use of a mask formed with a photo resist.

Subsequently, impurities are added to the semiconductor layer 52 so as to form a high concentration region using the gate electrode 54 as the mask. According to this step, a thin film transistor 70 comprising the semiconductor layer 52, the gate insulating layer 53, and the gate electrode 54 is formed.

The manufacturing process of the thin film transistor is not limited in particular, and may be modified appropriately so that a transistor having a desired structure can be manufactured.

Although this embodiment mode employs a top-gate thin film transistor using the crystalline silicon film obtained by the laser crystallization, a bottom-gate thin film transistor using an amorphous semiconductor film can also be applied to a pixel portion. Not only silicon but also silicon germanium can be used for the amorphous semiconductor. In the case of using silicon germanium, the concentration of germanium preferably ranges from approximately 0.01 to 4.5 atomic %.

Moreover, a microcrystal semiconductor (semi-amorphous semiconductor) film which includes crystal grains each having a diameter of 0.5 to 20 nm in the amorphous semiconductor may also be used. The microcrystal having the crystal grains with a diameter of 0.5 to 20 mm is also referred to as a so-called microcrystal (μc).

Semi-amorphous silicon (also referred to as SAS), which belongs to the semi-amorphous semiconductor, can be obtained by decomposing silicide gas according to glow discharging. As typical silicide gas, $SiH_4$ is given. Besides, $Si_2H_6$, $SiH_2Cl_2$, $SiHCl_3$, $SiCl_4$, $SiF_4$, or the like can be used. By using the silicide gas after diluting the silicide gas with hydrogen or hydrogen and one or plural kinds of inert gas selected from the group consisting of helium, argon, krypton, and neon, SAS can be easily formed. The silicide gas is preferably diluted with the dilution ratio of 1:10 to 1:1000. The reaction to form the film by the decomposition according to glow discharging may be conducted at the pressure ranging from 0.1 to 133 Pa. The electric power for forming the glow discharging may be supplied at high frequency in the range of 1 to 120 MHz, preferably 13 to 60 MHz. The substrate heat temperature is preferably 300° C. or less, preferably in the range of 100 to 250° C.

The Raman spectrum of thus formed SAS shifts to the side of lower wavenumber than 520 $cm^{-1}$. According to X-ray diffraction, diffraction peaks of a silicon crystal lattice are observed at (111) and (220). As a terminating agent of a dangling bond, hydrogen or halogen is added by at least 1 atomic % or more. As the impurity element in the film, the impurity in the air such as oxygen, nitrogen, and carbon is desirably $1 \times 10^{20}$ $cm^{-1}$ or less, and especially, the concentration of oxygen is $5 \times 10^{19}/cm^3$ or less, preferably $1 \times 10^{19}/cm^3$ or less. The mobility of a TFT manufactured with this film is $\mu = 1$ to 10 $cm^2/Vsec$.

This SAS may be used after being crystallized further with a laser beam.

Subsequently, an insulating film (hydride film) 59 is formed with silicon nitride so as to cover the gate electrode 54 and the gate insulating layer 53. After forming the insulating film (hydride film) 59, heat treatment for approximately 1 hour at 480° C. is conducted so as to activate the impurity element and to hydrogenate the semiconductor layer 52.

Figure 5B:
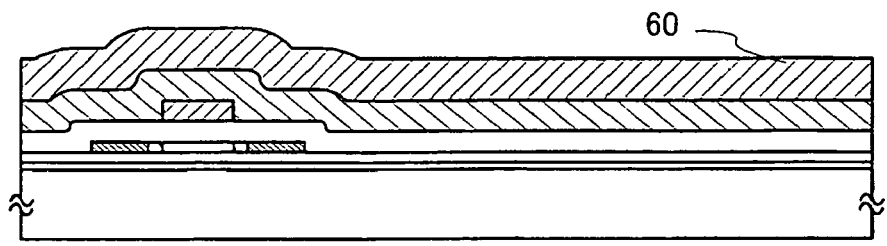

Subsequently, a first interlayer insulating layer 60 is formed so as to cover the insulating film (hydride film) 59. As a material for forming the first interlayer insulating layer 60, silicon oxide, acrylic, polyimide, siloxane, a low-k material, or the like is preferably used. In this embodiment mode, the first interlayer insulating layer is formed with silicon oxide (FIG. 5B)

Figure 5C:
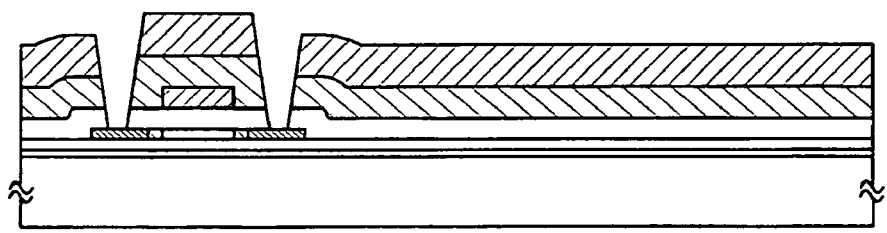

Next, contact holes that reach the semiconductor layer 52 are formed. The contact holes can be formed by etching with a resist mask until the semiconductor layer 52 is exposed. Either wet etching or dry etching can be applied. The etching may be conducted once or multiple times depending on the condition. When the etching is conducted multiple times, both of the wet etching and the dry etching may be conducted (FIG. 5C).

Figure 5D:
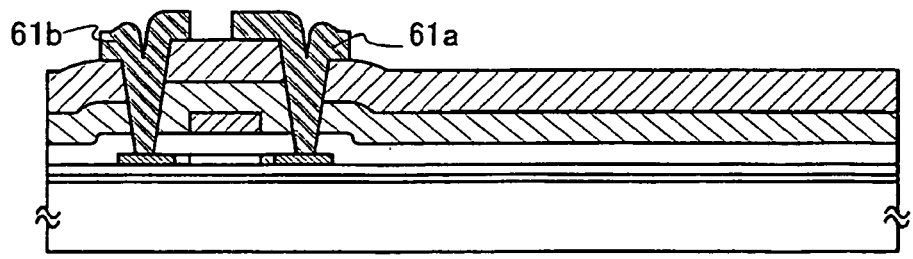

Then, a conductive layer is formed so as to cover the contact holes and the first interlayer insulating layer 60. A connection portion 61a, a wiring 61b, and the like are formed by processing the conductive layer into a desired shape. This wiring may be a single layer of aluminum, copper, or the like. In this embodiment mode, the wiring is formed in a multilayer structure of molybdenum/aluminum/molybdenum in order from the bottom. Alternatively, a structure of titanium/aluminum/titanium or titanium/titanium nitride/aluminum/titanium is also applicable (FIG. 5D).

Figure 5E:
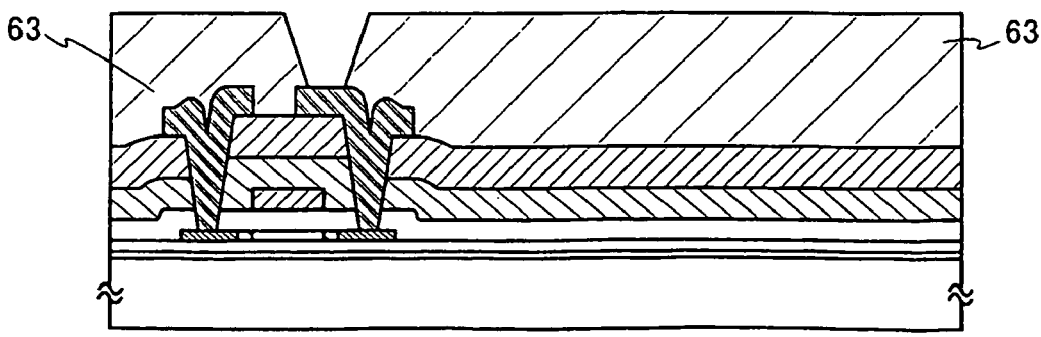

A second interlayer insulating layer 63 is formed so as to cover the connection portion 61a, the wiring 61b, and the first interlayer insulating layer 60. As the material of the second interlayer insulating layer 63, an applied film having self-flattening properties such as a film of acrylic, polyimide, siloxane, or the like is preferable. In this embodiment mode, the second interlayer insulating layer 63 is formed with siloxane (FIG. 5E).

Next, an insulating layer may be formed with silicon nitride over the second interlayer insulating layer 63. This is to prevent the second interlayer insulating layer 63 from being etched more than necessary in a later step of etching a pixel electrode. Therefore, the insulating layer is not necessary in particular when the difference of the etching rate is large between the pixel electrode and the second interlayer insulating layer. Next, a contact hole penetrating the second interlayer insulating layer 63 to reach the connection portion 61a is formed.

Figure 6A:
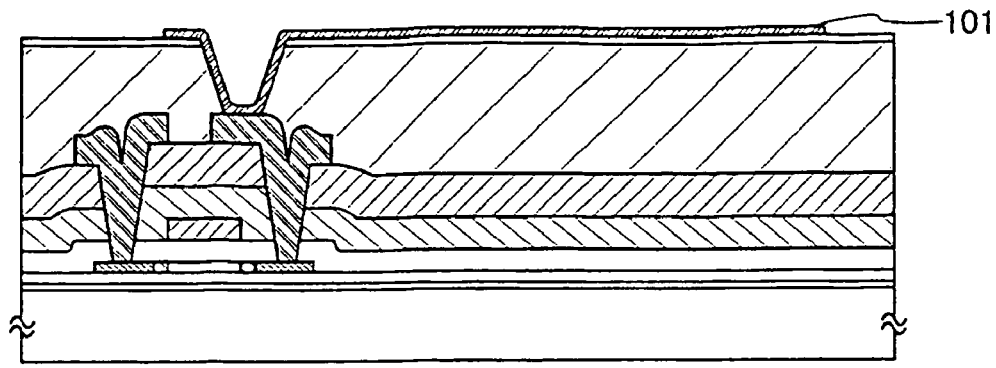
FIGS. 6A to 6C show a process for manufacturing a thin film light-emitting element according to the present invention.

Next, after a light-transmitting conductive layer is formed so as to cover the contact hole and the second interlayer insulating layer 63 (or the insulating layer), the light-transmitting conductive layer is processed to form the first electrode 101 of the thin film light-emitting element. Here, the first electrode (an electrode which receives electrons) 101 electrically contacts the connection portion 61a. As the material of the first electrode 101, it is preferable to use metal, alloy, an electrically conductive compound, or mixture of these each of which has a high work function (work function of 4.0 eV or more). For example, ITO (indium tin oxide), ITO containing silicon (ITSO), IZO (indium zinc oxide) in which zinc oxide (ZnO) is mixed by 2 to 20% into indium oxide, zinc oxide, GZO (gallium zinc oxide) in which gallium is contained in zinc oxide, gold (Au), platinum (Pt), nickel (Ni), tungsten (W), chromium (Cr), molybdenum (Mo), iron (Fe), cobalt (Co), copper (Cu), palladium (Pd), or metal nitride such as TiN can be used. In this embodiment mode, the first electrode 101 is formed with ITSO (FIG. 6A).

Figure 6B:
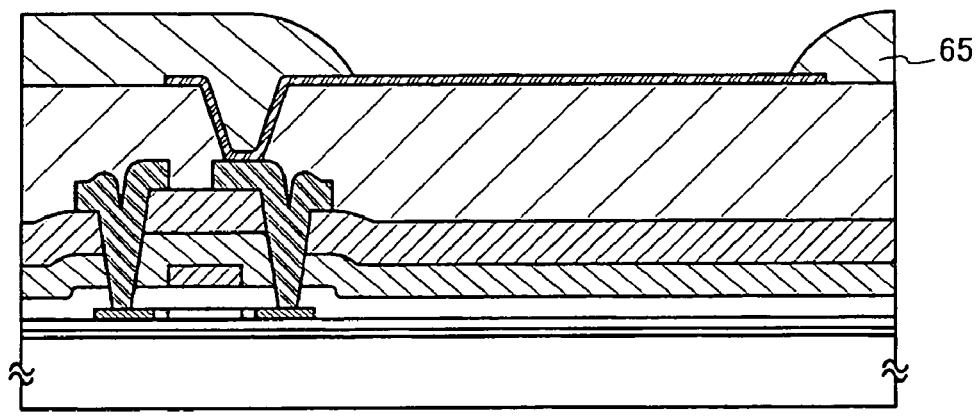
Figure 6C:
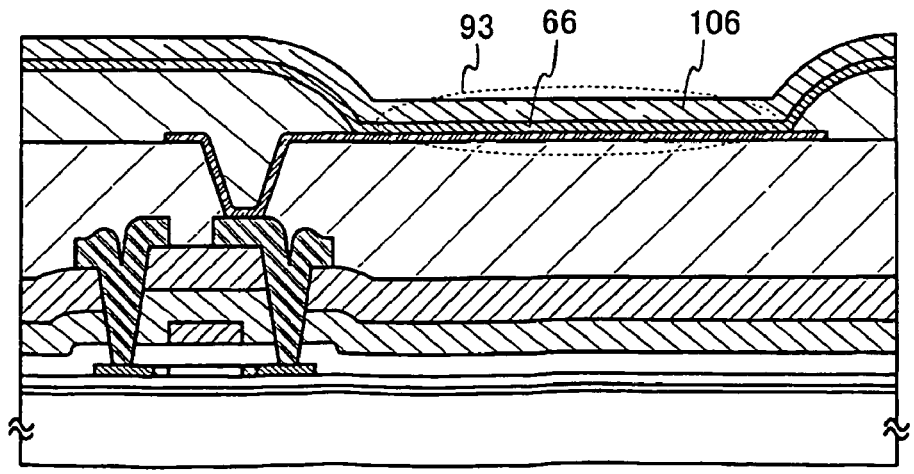

Next, an insulating layer formed with an organic material or an inorganic material is formed so as to cover the second interlayer insulating layer 63 (or the insulating layer) and the first electrode 101. Subsequently, the insulating layer is processed so as to partially expose the first electrode 101, thereby forming a partition wall 65. As the material of the partition wall 65, a photosensitive organic material (such as acrylic or polyimide) is preferable. Besides, a non-photosensitive organic material or inorganic material may also be used. Further, the partition wall 65 may be used as a black matrix by making the partition wall 65 black in such a way that a black pigment or dye such as titanium black or carbon nitride is diffused into the material of the partition wall 65 with the use of a diffuse material. It is desirable that the partition wall 65 has a tapered shape in its end surface toward the first electrode with its curvature changing continuously (FIG. 6B).

Next, a light-emitting stack 66 is formed so as to cover a part of the first electrode 101 that is exposed from the partition wall 65. In this embodiment mode, the light-emitting stack 66 may be formed by an evaporating method or the like. The light-emitting stack 66 is formed with the first hole-generating layer 102, the light-emitting layer 104, the electron-generating layer 105, and the second hole-generating layer 103 stacked in order.

Further, the first hole generating layer 102 and the second hole generating layer 103 are preferably formed with the same materials using a hole transporting material and an electron accepting material which can receive electrons from the hole transporting material; P-type semiconductor layer or a layer containing P-type semiconductor. As the hole-transporting material, for example, an aromatic amine compound (having a bond of a benzene ring with nitrogen), phthalocyanine (abbreviated to $H_2Pc$), or a phthalocyanine compound such as copper phthalocyanine (abbreviated to CuPc) or vanadyl phthalocyanine (abbreviated to VOPc) can be used. The aromatic amine compound is, for example, 4,4'-bis[N-(1-naphthyl)-N-phenyl-amino]-biphenyl (abbreviated to α-NPD), 4,4'-bis[N-(3-methylphenyl)-N-phenyl-amino]-biphenyl (abbreviated to TPD), 4,4',4''-tris(N,N-diphenyl-amino)-triphenylamine (abbreviated to TDATA), 4,4',4'-tris[N-(3-methylphenyl)-N-phenyl-amino]-triphenylamine (abbreviated to MTDATA), 4,4'-bis(N-(4-(N,N-di-m-tolylamino)phenyl)-N-phenylamino)biphenyl (abbreviated to DNTPD), or 1,3,5-tris[N,N-di(m-tolyl)amino]benzene (abbreviated to m-MTDAB). As the electron-accepting material which can receive electrons from the hole-transporting material, for example, molybdenum oxide ($MoO_x$), vanadium oxide, 7,7,8,8,-tetracyanoquinodimethane (abbreviated to TCNQ), 2,3-dicyanonaphtoquinone (abbreviated to DCNNQ), 2,3,5,6-tetrafluoro-7,7,8,8,-tetracyanoquinodimethane (abbreviated to F4-TCNQ), or the like is used. The electron-accepting material is selected which can receive electrons in accordance with the combination with the hole-transporting material. Further, metal oxide such as molybdenum oxide ($MoO_x$), vanadium oxide, ruthenium oxide, cobalt oxide, nickel oxide, or copper oxide can be used as the P-type semiconductor. Note that the above materials are only example and the material can be appropriately selected by a practitioner. The mixture ratio of an electron accepting material which can receive electrons from a hole transporting material to the hole transporting material may be 0.5 or more, in molar ratio, preferably, 0.5 to 2. Further, the difference between the molar ratio of the electron accepting material to the hole transporting material in the second hole generating layer and the molar ratio of the electron accepting material to the hole transporting material in the first hole generating layer is preferably in the range of 80% of the molar ratio of the electron accepting material to the hole transporting material in the second hole generating layer and also in the range of 80% of the molar ratio of the electron accepting material to the hole transporting material in the first hole generating layer. More preferably, the difference between the molar ratio of the electron accepting material to the hole transporting material in the second hole generating layer and the molar ratio of the electron accepting material to the hole transporting material in the first hole generating layer is in the range of 40% of the molar ratio of the electron accepting material to the hole transporting material in the second hole generating layer and also in the range of 40% of the molar ratio of the electron accepting material to the hole transporting material in the first hole generating layer. In the first hole generating layer and the second hole generating layer in this embodiment, α-NPD is used as the electron transporting material, and molybdenum oxide ($MoO_3$) is used as the electron accepting material which can receive electrons from α-NPD. Deposition is performed by co-evaporation so as to satisfy α-NPD: $MoO_3$=4:1 (corresponds to 1 in molar ratio) by weight.

The layer containing a plurality of materials can be formed by depositing the materials simultaneously. For example, the same methods or different methods of co-evaporation by resistance heating, co-evaporation by electron beam deposition, co-evaporation by resistance heating and electron beam deposition, deposition by resistance heating and sputtering, deposition by electron beam deposition and sputtering, and the like may be combined to form the layer. In the above case, two materials are used; however, three or more materials may also be used to form the layer in the same manner.

The thickness of the first hole generating layer and the second hole generating layer is to be 30 nm to 1 μm; further, the thickness of the second hole generating layer is not to be thicker or thinner than that of the first hole generating layer by more than 50%. Meanwhile, the thickness of the first hole generating layer is not to be thicker or thinner than that of the second hole generating layer by more than 50%. More preferably, the thicknesses of the first hole generating layer and the second hole generating layer are the same as in this embodiment mode. In this embodiment mode, the thickness of the first hole generating layer is set to be 50 nm and the thickness of the second hole generating layer is set to be 50 nm. The first hole generating layer 102 and the second hole generating layer 103 are preferably formed with a layer containing both a hole transporting material and an electron accepting material which can receive electrons from the hole transporting material. The difference between the molar ratio of the electron accepting material to the hole transporting material in the second hole generating layer 103 and the molar ratio of the electron accepting material to the hole transporting material in the first hole generating layer 102 is preferably in the range of 80% of the molar ratio of the electron accepting material to the hole transporting material in the second hole generating layer 103 and also in the range of 80% of the molar ratio of the electron accepting material to the hole transporting material in the first hole generating layer 102. More preferably, the difference between the molar ratio of the electron accepting material to the hole transporting material in the second hole generating layer 103 and the molar ratio of the electron accepting material to the hole transporting material in the first hole generating layer 102 is in the range of 40% of the molar ratio of the electron accepting material to the hole transporting material in the second hole generating layer 103 and also in the range of 40% of the molar ratio of the electron accepting material to the hole transporting material in the first hole generating layer 102.

For the first hole generating layer 102 and the second hole generating layer 103, a first layer and a second layer, each of which is formed with a layer containing the above described hole transporting material and an inorganic material of zinc oxide, indium oxide, tin oxide, antimony oxide, indium nitride, tin nitride, antimony nitride, a tungsten nitride, or molybdenum nitride. The thickness of the first layer and the second layer is preferably 30 nm to 1 μm. Further, the thicknesses of the first layer and the second layer are preferably almost the same, and the thickness of the second layer is not to be thicker or thinner than that of the first layer by more than 50%. Meanwhile, the thickness of the first layer is not to be thicker or thinner than that of the second layer by more than 50%. In other words, the thickness of the second layer is 50% to 150% of the thickness of the first layer, and the thickness of the first layer is 50% to 150% of the thickness of the second layer. Further, the first layer and the second layer are preferably formed with respective layers containing the same hole transporting material and the same inorganic material. The difference between the molar ratio of the electron accepting material to the hole transporting material in the second layer and the molar ratio of the electron accepting material to the hole transporting material in the first layer is preferably in the range of 80% of the molar ratio of the electron accepting material to the hole transporting material in the second layer and also in the range of 80% of the molar ratio of the electron accepting material to the hole transporting material in the first layer. More preferably, the difference between the molar ratio of the electron accepting material to the hole transporting material in the second layer and the molar ratio of the electron accepting material to the hole transporting material in the first layer is in the range of 40% of the molar ratio of the electron accepting material to the hole transporting material in the second layer and also in the range of 40% of the molar ratio of the electron accepting material to the hole transporting material in the first layer.

When the light-emitting layer 104 is formed with a layer in which a light-emitting material to be the light-emission center is diffused in the layer containing the material having larger energy gap than the light-emitting material, the following material can be used as the light-emitting material to be the luminescence center; 4-dicyanomethylene-2-methyl-6-[-2-(1,1,7,7-tetramethyl-9-julolidyl)ethenyl)-4H-pyran (abbreviation: DCJT); 4-dicyanomethylene-2-t-butyl-6-[2-(1,1,7, 7-tetramethyl-julolidine-9-yl)ethenyl]-4H-pyran; periflanthene; 2,5-dicyano-1,4-bis[2-(10-methoxy-1,1,7,7-tetramethyl-julolidine-9-yl)ethenyl]benzene, N,N'-dimethylquinacridone (abbreviated to DMQd), coumarin 6, coumarin 545T, tris (8-quinolinolato)aluminum (abbreviated to $Alq_3$), 9,9'-bianthryl, 9,10-diphenylanthracene (abbreviated to DPA), 9,10-bis(2-naphthyl)anthracene (abbreviated to DNA), 2,5,8,11-tetra-t-butylperylene (abbreviated to TBP), or the like. As the material to be a base material in which the light-emitting material is diffused, the following can be used; an anthracene derivative such as 9,10-di(2-naphtyl)-2-tert-butylanthracene (abbreviated to t-BuDNA), a carbazole derivative such as 4,4'-bis(N-carbazolyl)biphenyl (abbreviated to CBP), or a metal complex such as tris(8-quinolinolato) aluminum (abbreviated to $Alq_3$), tris(4-methyl-8-quinolinolato)aluminum (abbreviated to $Almq_3$), bis(10-hydroxybenzo [h]-quinolinato)beryllium (abbreviated to $BeBq_2$), bis(2-methyl-8-quinolinolato)-4-phenylphenolato-aluminum (abbreviated to BAlq), bis[2-(2-hydroxyphenyl)pyridinato] zinc (abbreviated to $Znpp_2$), or bis[2-(2-hydroxyphenyl)benzoxazolate]zinc (abbreviated to ZnBOX). As the material which can constitute the light-emitting layer 104 singly, tris (8-quinolinolato)aluminum (abbreviated to $Alq_3$), 9,10-bis (2-naphtyl)anthracene (abbreviated to DNA), bis(2-methyl-8-quinolinolato)-4-phenylphenolato-aluminum (abbreviated to BAlq), or the like can be used to form the light emitting layer 104.

The light-emitting layer 104 may be formed either in a single-layer structure or a multilayer structure. Moreover, a hole-transporting layer may be provided between the first hole-generating layer 102 and the layer in which the light-emitting material is diffused in the light-emitting layer 104 (or the layer containing the light-emitting material). Further, an electron-transporting layer may be provided between the electron-generating layer 105 and the layer in which the light-emitting material is diffused in the light-emitting layer 104 (or the layer containing the light-emitting material). These layers are not necessarily provided, and only one of the hole-transporting layer and the electron-transporting layer may be provided. The materials of the hole-transporting layer and the electron-transporting layer conform to those of the hole-transporting layer in the hole-generating layer and the electron-transporting layer in the electron-generating layer; therefore, the description is omitted here. Refer to the description of those layers.

In this embodiment mode, the hole-transporting layer, the layer in which the light-emitting material is diffused, and the electron-transporting layer are formed in order as the light-emitting layer 104 over the hole-generating layer 102. α-NPD is deposited to the thickness of 10 nm as the hole-transporting layer, Alq and coumarin 6 are deposited to the thickness of 35 nm at a weight ratio of 1:0.005 as the layer in which the light-emitting material is diffused, and Alq is deposited to the thickness of 10 nm as the electron-transporting layer.

As the electron-generating layer 105, a layer containing both of an electron-transporting material and an electron donating material which can donate electrons to the electron-transporting material, an N-type semiconductor layer, or a layer containing an N-type semiconductor can be used. As the electron-transporting material, for example, the following can be used; a metal complex having a quinoline skeleton or a benzoquinoline skeleton such as tris-(8-quinolinolato)aluminum (abbreviated to $Alq_3$), tris(4-methyl-8-quinolinolato) aluminum (abbreviated to $Almq_3$), bis(10-hydroxybenzo[h]-quinolinolato)beryllium (abbreviated to $BeBq_2$), or bis(2-methyl-8-quinolinolato)-4-phenylphenolato-aluminum (abbreviated to BAlq). Besides, a metal complex having an oxazole or thiazole ligand such as bis[2-(2-hydroxyphenyl) benzoxazolate]zinc (abbreviated to $Zn(BOX)_2$) or bis[2-(2-hydroxyphenyl)benzothiazolate]zinc (abbreviated to $Zn(BTZ)_2$) can be used. In addition to the metal complex, 2-(4-biphenylyl)-5-(4-tert-butylphenyl)-1,3,4-oxadiazole (abbreviated to PBD), 1,3-bis[5-(p-tert-butylphenyl)-1,3,4-oxadiazole-2-yl]benzene (abbreviated to OXD-7), 3-(4-tert-butylphenyl)-4-phenyl-5-(4-biphenylyl)-1,2,4-triazole (abbreviated to TAZ), 3-(4-tert-butylphenyl)-4-(4-ethylphenyl)-5-(4-biphenylyl)-1,2,4-triazole (abbreviated to p-EtTAZ), bathophenanthroline (abbreviated to BPhen), bathocuproin (abbreviated to BCP), or the like can be used. As the electron donating material which can donate electrons to the electron-transporting material, for example, alkali metal such as lithium or cesium, alkali-earth metal such as magnesium or calcium, or rare-earth metal such as erbium or ytterbium can be used. The electron donating material which can donate electrons is selected in accordance with the combination with the electron-transporting material. Further, for example, zinc oxide, zinc sulfide, zinc selenide, titanium oxide, or the like can be used the N-type semiconductor.

The mixture ratio between the electron-transporting material and the electron-donating material which can supply electrons to the electron-transporting material is approximately 1:0.5 to 1:2, preferably 1:1, in molar ratio. The electron-transporting material is formed of Alq and the electron-donating material which can supply electrons to Alq is formed of lithium (Li) in the electron-generating layer in this embodiment mode. Deposition is performed by the co-evaporating method so as to satisfy Alq:Li=1:0.01 in weight ratio. The film thickness is set to 10 nm.

A light-emitting element which emits light with a different emission wavelength may be formed for each pixel to perform color display. Typically, light-emitting elements corresponding to the respective colors of R (red), G (green), and B (blue) are formed. Even in this case, the color purity can be increased and the pixel area can be prevented from mirroring (reflecting) by providing, at a side of the pixel from which the light is emitted, a filter (colored layer) which transmits light of the emission wavelength. By providing the filter (colored layer), a circular polarizing plate which has been conventionally required can be omitted and the loss of the light emitted from the light-emitting element can be reduced. Moreover, the change of the color tone recognized when viewing the pixel area (display screen) obliquely can be reduced.

The light-emitting element can have a structure in which light of a single color or a white color is emitted. In the case of using the light-emitting element of the white color, a filter (color layer) to transmit the light of a particular wavelength is provided at a side of the pixel from which the light is emitted. Thus, the color display can be conducted.

In order to form a light-emitting layer which emits white light, the white light can be obtained by stacking, for example, $Alq_3$, $Alq_3$ partly doped with nile red, which is a pigment for red light emission, $Alq_3$, p-EtTAZ, and TPD (aromatic diamine) sequentially by vapor deposition.

Moreover, the light-emitting layer may be formed using a triplet-excited light-emitting material containing a metal complex and the like other than a singlet-excited light-emitting material. For example, among a red light-emitting pixel, a green light-emitting pixel, and a blue light-emitting pixel; the red light-emitting pixel, which has a relatively short half-life period, is formed with the triplet excited light-emitting material, and the others are formed with the singlet-excited light-emitting material. Since the triplet-excited light emitting material has high emission efficiency, less power is consumed to obtain the same luminance. Accordingly, in the case of applying the triplet-excited light-emitting material to the red pixel, the reliability can be improved because the amount of current flowing into the light-emitting element is small. In order to reduce lower power consumption, the red light-emitting pixel and the green light-emitting pixel may be formed with a triplet-excited light-emitting material, and a blue light-emitting pixel may be formed with the singlet-excited light-emitting material. By forming the green light-emitting element, to which visual sensitivity is high, also with the triplet-excited light-emitting material, power consumption can be reduced.

As an example of the triplet-excited light-emitting material, the following can be employed; a material using a metal complex as a dopant, such as a metal complex containing platinum, which is one of third transition elements, as metal center or a metal complex containing iridium as metal center. The triplet-excited light-emitting material is not limited to these compounds, and another compound which has the above structure and contain an element belonging to any one of groups 8 to 10 in the periodic table as metal center can be used.

The light-emitting element formed with the above material emits light by being forward biased. A pixel of a display device formed using the light-emitting element can be driven by a simple matrix method or an active matrix method. In any way, the respective pixels emit light by being applied with forward bias at a particular timing and do not emit light for a certain period. The reliability of the light-emitting element can be increased by applying a reverse bias in this non-emission period. The light-emitting element has deterioration modes in which light-emission intensity decreases under a certain drive condition or the luminance seems to decrease because a non-emission region expands within the pixel. However, when alternate driving is conducted by applying bias in the forward and reverse directions, the progress of the deterioration can be slowed down and the reliability of the light-emitting device can be improved.

Subsequently, the second electrode 106 is formed so as to cover the light-emitting stack 66. Accordingly, a light-emitting element 93 including the first electrode 101, the light-emitting stack 66, and the second electrode 106 can be manufactured. Note that, in this embodiment mode, when voltage is applied so as to make a light emitting element emit light, the electrode applied with higher potential is the first electrode, and the electrode applied with lower potential is the second electrode. As the second electrode material used for forming the second electrode 106, it is preferable to use metal, an alloy, an electrically conductive compound, a mixture thereof, or the like each of which has low work function (work function of 3.8 eV or less). As a specific example of the second electrode material, the following can be used; an element belonging to group 1 or 2 in the periodic table, that is, an alkali metal such as Li or Cs, an alkaline-earth metal such as Mg, Ca or Sr, an alloy containing those elements such as Mg:Ag or Al:Li, or a compound containing those elements such as LiF, CsF, or $CaF_2$. In addition, the second electrode can also be formed with a transition metal containing a rare-earth metal. Further, a multilayer containing the above element and another metal (including an alloy) such as Al, Ag, or ITO can be used. In this embodiment mode, the second electrode is formed of aluminum.

In the light-emitting element having the above structure, the drive voltage is low and increase in the drive voltage over time is small.

Further, the stress to the light emitting layer can be alleviated, so that the reliability of the light emitting element can be improved.

The electrode in electrical contact with the connection portion 61a is the first electrode 101 in this embodiment mode. However, the electrode in electrical contact with the connection portion 61a may be the second electrode 106. In this case, the light-emitting stack 66 may be formed by stacking the second hole-generating layer 103, the electron-generating layer 105, the light-emitting layer 104, and the first hole-generating layer 102 in order, and the first electrode 101 may be formed over the light-emitting stack 66.

After that, a silicon oxide film containing nitrogen is formed as a second passivation film by plasma CVD. In the case of using the silicon oxide film containing nitrogen, a silicon oxynitride film manufactured from $SiH_4$, $N_2O$, and $NH_3$ by plasma CVD, a silicon oxynitride film manufactured from $SiH_4$ and $N_2O$ by plasma CVD, or a silicon oxynitride film manufactured from a gas in which $SiH_4$ and $N_2O$ are diluted with Ar by plasma CVD is preferably formed.

As a first passivation film, a silicon oxynitride hydride film manufactured with $SiH_4$, $N_2O$, and $H_2$ is also applicable. The structure of the first passivation film is not limited to a single-layer structure, and the first passivation film may be formed in a single-layer structure or a multilayer structure of another insulating layer containing silicon. A multilayer film of a carbon nitride film and a silicon nitride film, a multilayer film of styrene polymer, a silicon nitride film, or a diamond-like carbon film may be formed instead of a silicon oxide film containing nitrogen.

Subsequently, in order to protect the light emitting element from a deterioration-promoting material such as moisture, the display portion is sealed. In the case of using a counter substrate for the sealing, the counter substrate and an element substrate are pasted together by an insulating sealing material so as to expose an external connection portion. The space between the counter substrate and the element substrate may be filled with an inert gas such as dry nitrogen, or the sealing material may be applied to the whole surface of the pixel area for pasting the counter substrate. It is preferable to use an ultraviolet curable resin or the like as the sealing material. A drying agent or particles for keeping the gap between the substrates uniform may be mixed into the sealing material. Subsequently, a flexible wiring substrate is pasted on the external connection portion, thereby completing the display device.

An example of the structure of the thus manufactured display device will be described with reference to FIGS. 7A and 7B. Although the shapes are different, the same parts having the same function are denoted with the same reference numerals and the description to such parts may be omitted. In this embodiment mode, the thin film transistor 70 having an LDD structure connects to the light-emitting element 93 via the connection portion 61a.

Figure 7A:
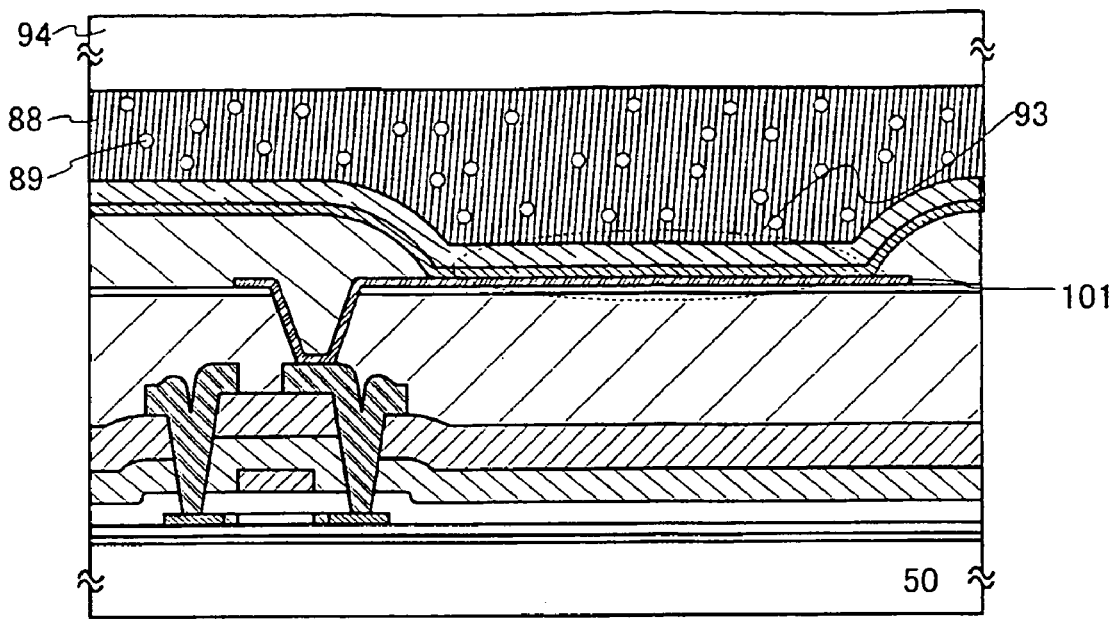
FIGS. 7A and 7B show an example of a structure of a display device according to the present invention.

In FIG. 7A, the first electrode 101 is formed with a light-transmitting conductive film and has a structure in which light emitted from the light-emitting stack 66 is extracted to the side of the substrate 50. Reference numeral 94 denotes a counter substrate, which is to be fixed to the substrate 50 with a sealing material or the like after forming the light-emitting element 93. By filling the space between the counter substrate 94 and the element with a light-transmitting resin 88 or the like and sealing the space, it is possible to prevent the light-emitting element 93 from deteriorating due to the moisture. Further, the resin 88 desirably has hygroscopicity. In addition, it is more desirable that a drying agent 89 having high light-transmitting properties is diffused in the resin 88, so that the effect of moisture can be suppressed further.

Figure 7B:
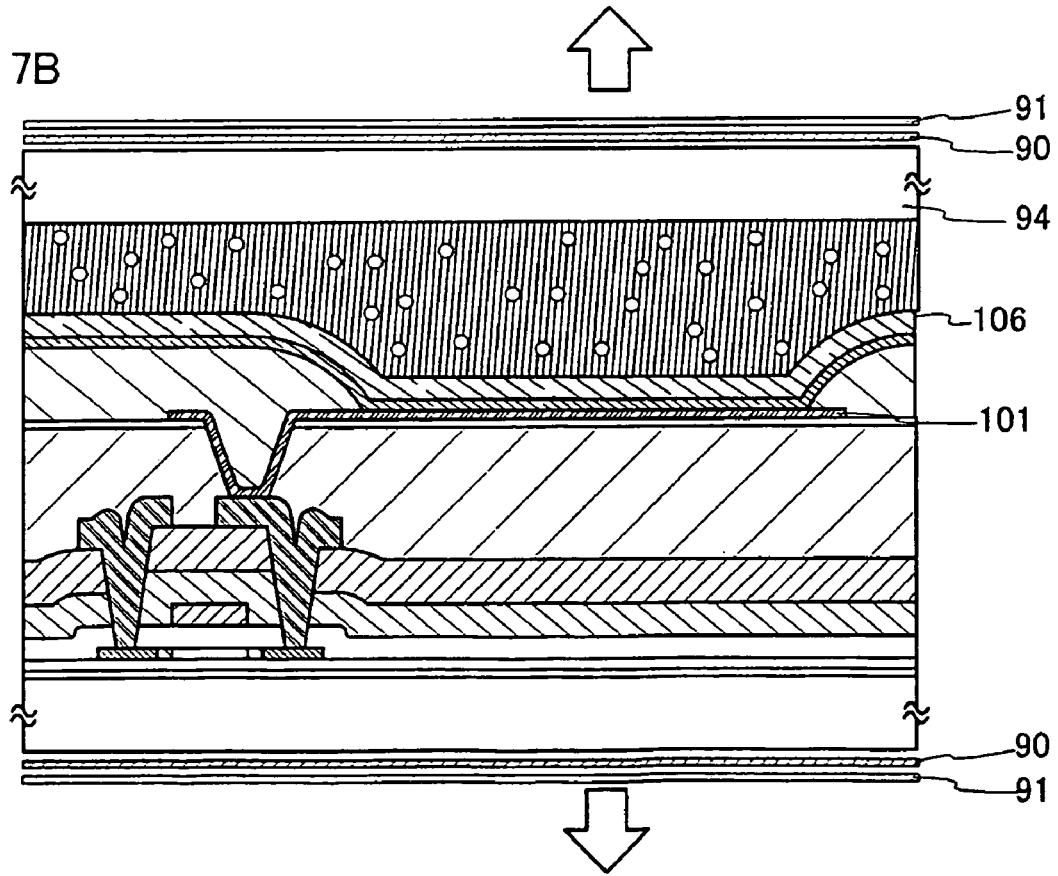

In FIG. 7B, either the first electrode 101 or the second electrode 106 is formed with a light-transmitting conductive film and has a structure in which light can be extracted toward both of the substrate 50 and the counter substrate 94. With this structure, it is possible to prevent the screen from becoming transparent by respectively providing polarizing plates 90 outside the substrate 50 and the counter substrate 94, whereby increasing the visibility. A protective film 91 is preferably provided outside the polarizing plate 90.

Either an analog video signal or a digital video signal may be used in the display device having a display function according to the present invention. The digital video signal includes a video signal using voltage and a video signal using current. When the light-emitting element emits light, the video signal inputted into the pixel uses a constant voltage or a constant current. When the video signal uses a constant voltage, the voltage applied to the light-emitting element or the current flowing in the light-emitting element is constant. On the other hand, when the video signal uses the constant current, the voltage applied to the light-emitting element or the current flowing in the light-emitting element is constant. The light-emitting element to which the constant voltage is applied is driven by the constant voltage, and the light-emitting element in which the constant current flows is driven by the constant current. A constant current flows in the light-emitting element driven by the constant current without being affected by the change of the resistance of the light-emitting element. Either one of constant voltage drive or constant current drive and a video signal of either voltage or current can be used for a light emitting device and the driving method thereof according to the present invention.

In the display device according to the present invention manufactured by the method in this embodiment mode, the drive voltage is low and the increase in the drive voltage over time is small. Further, the display device is highly reliable.

Embodiment Mode 4

Figure 8A:
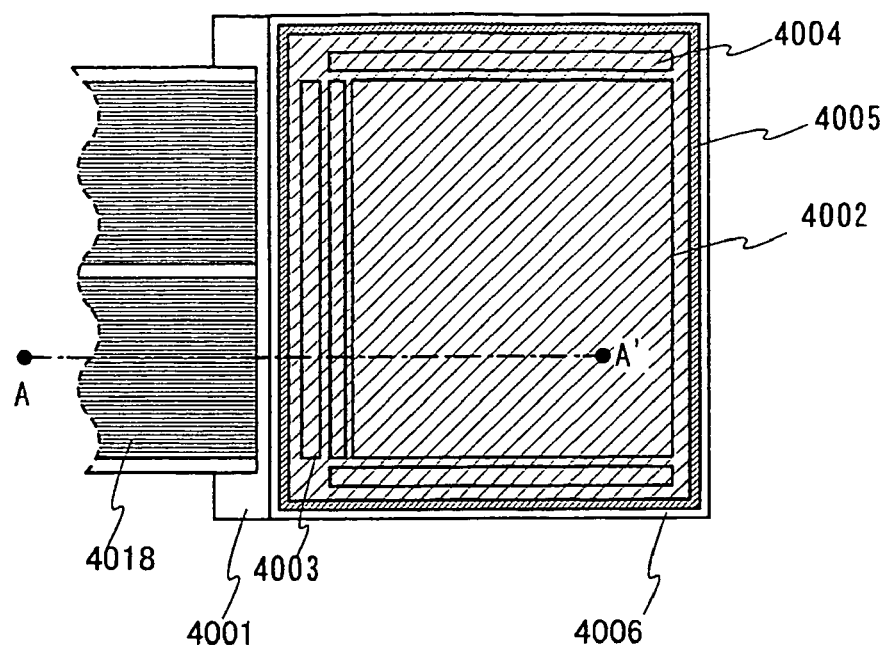
FIGS. 8A and 8B show a top view and a cross-sectional view of a light-emitting device according to the present invention.
Figure 8B:
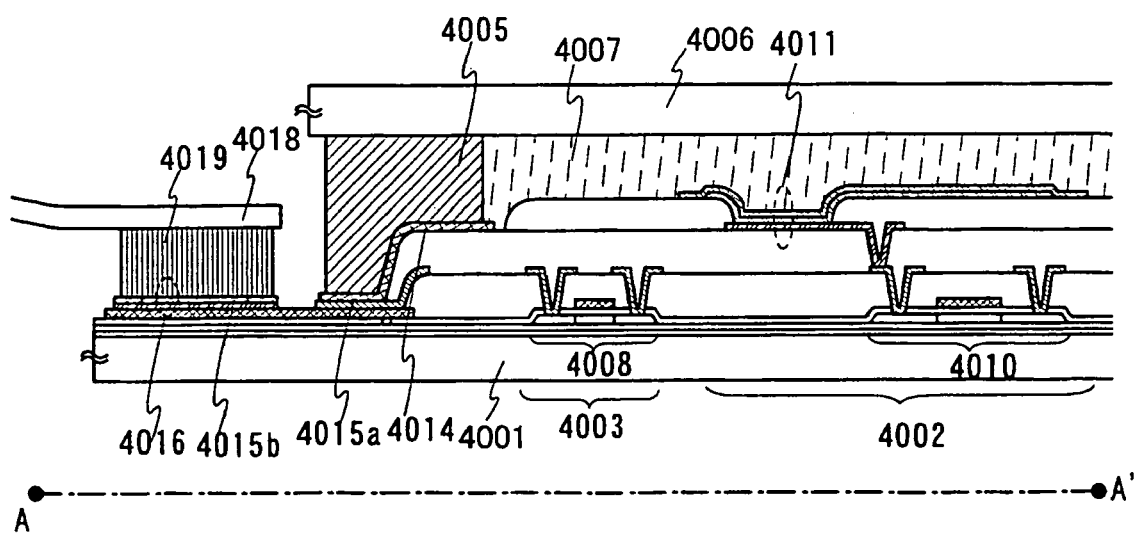

This embodiment mode will describe an appearance of a panel of a light-emitting device corresponding to one aspect of the present invention with reference to FIGS. 8A and 8B.

FIG. 8A is a top view of a panel in which a transistor and a light-emitting element formed over a substrate are sealed with a sealing material formed between the substrate and a counter substrate 4006. FIG. 8B is a cross-sectional view corresponds to FIG. 8A. The light-emitting element mounted in this panel has a structure in which respective layers in contact with a pair of electrodes consisting of a first electrode and a second electrode are hole-generating layers, so that a light-emitting layer is sandwiched between the hole-generating layers. Moreover, in the light-emitting element, an electron-generating layer is provided between the hole-generating layer on a second electrode side and the light-emitting layer. In this embodiment mode, when voltage is applied so as to make a light emitting element emit light, the electrode applied with higher potential is the first electrode, and the electrode applied with lower potential is the second electrode. The hole generating layers are formed of the same material. The thickness of the hole generating layer formed on the counter substrate side is not thicker or thinner than that of the hole generating layer formed on the substrate side by more than 50%. Further, the thickness of the hole generating layer formed on the substrate side is not thicker or thinner than that of the hole generating layer formed on the counter substrate side by more than 50%. The thickness of the hole generating layer formed on the counter substrate side and the hole generating layer formed on the substrate side is to be 30 nm to 1 µm.

A sealing material 4005 is provided so as to surround a pixel area 4002, a signal line driver circuit 4003, and a scan line driver circuit 4004 which are provided over a substrate 4001. In addition, the counter substrate 4006 is provided over the pixel area 4002, the signal line driver circuit 4003, and the scan line driver circuit 4004. Thus, the pixel area 4002, the signal line driver circuit 4003, and the scan line driver circuit 4004 together with the filler 4007 are sealed with the substrate 4001, the sealing material 4005, and the counter substrate 4006.

The pixel area 4002, the signal line driver circuit 4003, and the scan line driver circuit 4004 provided over the substrate 4001 have a plurality of thin film transistors. FIG. 8B shows a thin film transistor 4008 included in the signal line driver circuit 4003 and a thin film transistor 4010 included in the pixel area 4002.

The light-emitting element 4011 is connected electrically to the thin film transistor 4010.

Further, a lead wiring 4014 corresponds to a wiring for supplying a signal or a power source voltage to the pixel area 4002, the signal line driver circuit 4003, and the scan line driver circuit 4004. The lead wiring 4014 is connected to a connection terminal 4016 via a lead wiring 4015a and a lead wiring 4015b. The connection terminal 4016 is electrically connected to a terminal of a flexible printed circuit (FPC) 4018 via an anisotropic conductive film 4019.

As the filler 4007, in addition to inert gas such as nitrogen or argon, an ultraviolet curable resin or a thermosetting resin can be used. For example, polyvinyl chloride, acrylic, polyimide, an epoxy resin, a silicon resin, polyvinyl butyral, or ethylene vinylene acetate can be used.

It is to be noted that the display device according to the present invention includes in its category the panel in which the pixel area having the light-emitting element is formed and a module in which an IC is mounted on the panel.

In the panel and the module having the structure shown in this embodiment mode, the drive voltage is low and increase in the drive voltage over time is small. Further, the reliability of the panel and the module is high.

Embodiment Mode 5

As an electronic appliance according to the present invention to which a module, for example, the module which has been exemplified in Embodiment Mode 4, is mounted, the following is given; a camera such as a video camera or a digital camera, a goggle type display (head mount display), a navigation system, a sound reproduction device (car audio component or the like), a computer, a game machine, a mobile information terminal (a mobile computer, a mobile telephone, a mobile game machine, an electronic book, or the like), an image reproduction device equipped with a recording medium (specifically a device which reproduces the recording medium such as a digital versatile disc (DVD) and which is equipped with a display for displaying the image), or the like. FIGS. 9A to 9E show specific examples of those electronic appliances.

Figure 9A:
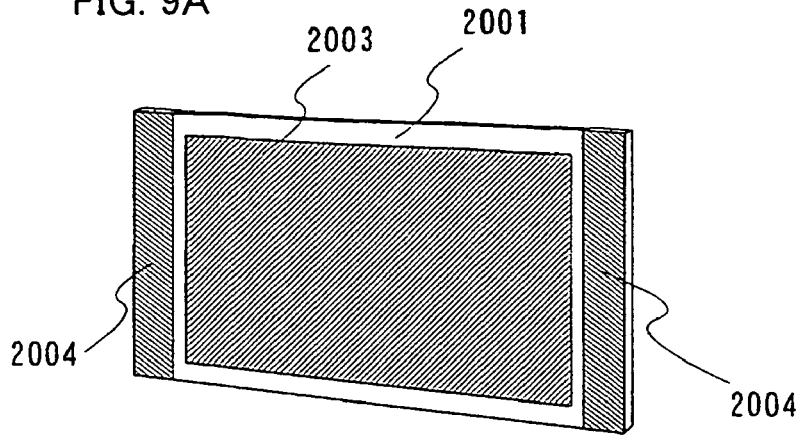
FIGS. 9A to 9E show examples of electronic appliances to which the present invention can be applied.

FIG. 9A shows a light-emitting display device, which corresponds to, for example, a television receiving device or a monitor of a personal computer. The light-emitting display device according to the present invention includes a case 2001, a display portion 2003, speaker portions 2004, and the like. In the light-emitting display device according to the present invention, the drive voltage of the display portion 2003 is low and increase in the drive voltage of the display portion 2003 over time is small. Further, the reliability of the display portion 2003 is high. In the pixel area, a polarizing plate or a circular polarizing plate is preferably provided in the pixel area to improve the contrast. For example, films are preferably provided in the order of a quarter wave-plate, a half wave-plate, and a polarizing plate on a sealing substrate. Further, an anti-reflection film may be provided over the polarizing plate.

Figure 9B:
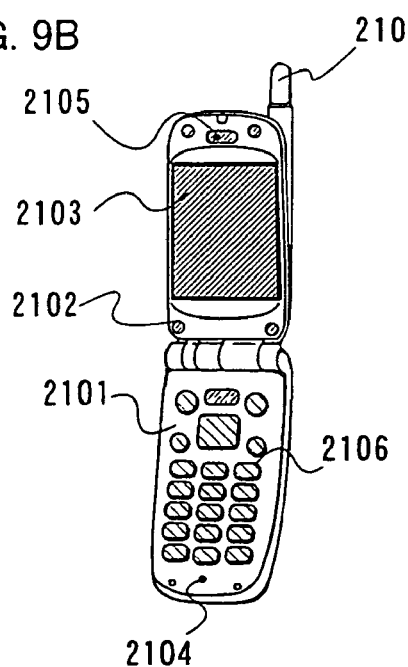

FIG. 9B shows a mobile phone including a main body 2101, a case 2102, a display portion 2103, an audio input portion 2104, an audio output portion 2105, operation keys 2106, an antenna 2108, and the like. In the display portion 2103 of the mobile phone according to the present invention, the drive voltage is low and increase in the drive voltage over time is small. Further, the reliability of the display portion 2103 is high.

Figure 9C:
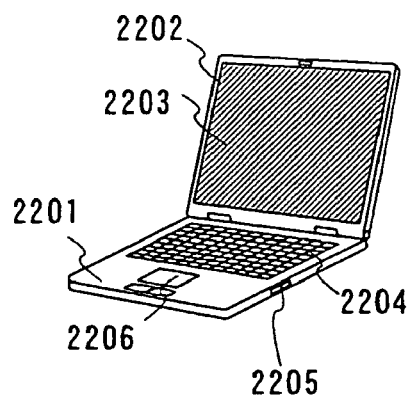

FIG. 9C shows a computer including a main body 2201, a case 2202, a display portion 2203, a keyboard 2204, an external connection portion 2205, a pointing mouse 2206, and the like. In the display portion 2203 of the computer according to the present invention, the drive voltage is low and increase in the drive voltage over time is small. Further, the reliability of the display portion 2203 is high. Although FIG. 9C shows a laptop computer, the present invention is also applicable to a desktop computer in which a hard disk is integral with a display portion.

Figure 9D:
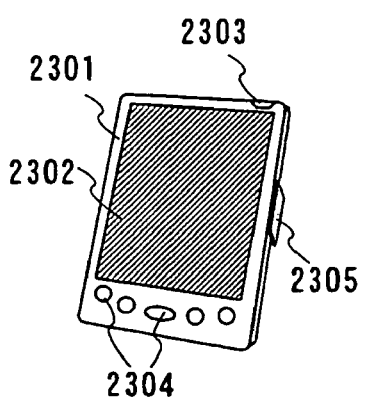

FIG. 9D shows a mobile computer including a main body 2301, a display portion 2302, a switch 2303, operation keys 2304, an infrared port 2305, and the like. In the display portion 2302 of the mobile computer according to the present invention, the drive voltage is low and the increase in the drive voltage over time is small. Further, the reliability of the display portion 2302 is high.

Figure 9E:
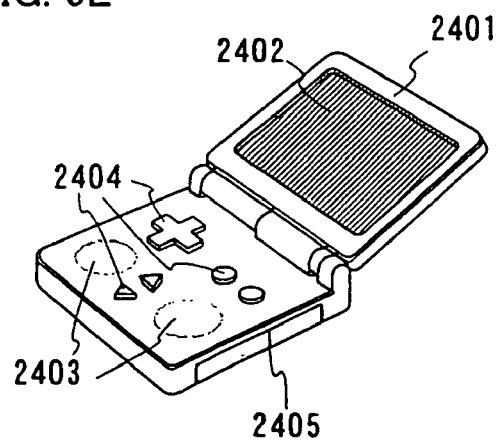

FIG. 9E shows a mobile game machine including a case 2401, a display portion 2402, speaker portions 2403, operation keys 2404, an recording medium insert portion 2405, and the like. In the display portion 2402 of the mobile game machine according to the present invention, the drive voltage is low and the increase in the drive voltage over time is small. Further, the reliability of the display portion 2402 is high.

As thus described, the present invention can be widely applied, and can be used in electronic appliances of every field.

Embodiment Mode 6

Figure 10A:
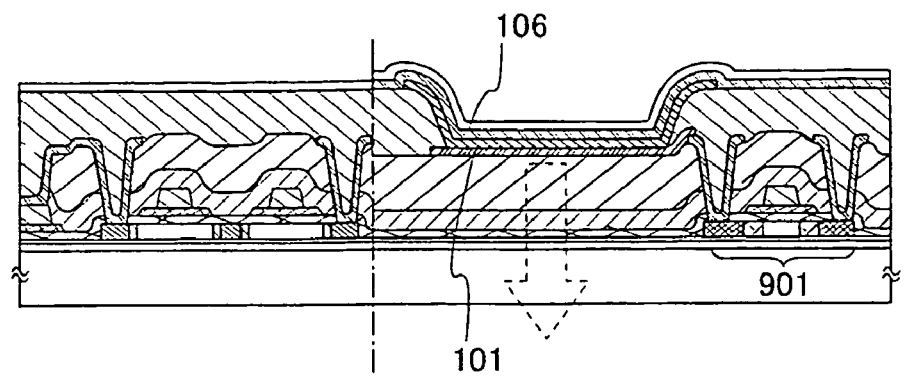
FIGS. 10A to 10C show examples of structures of a display device according to the present invention.
Figure 10B:
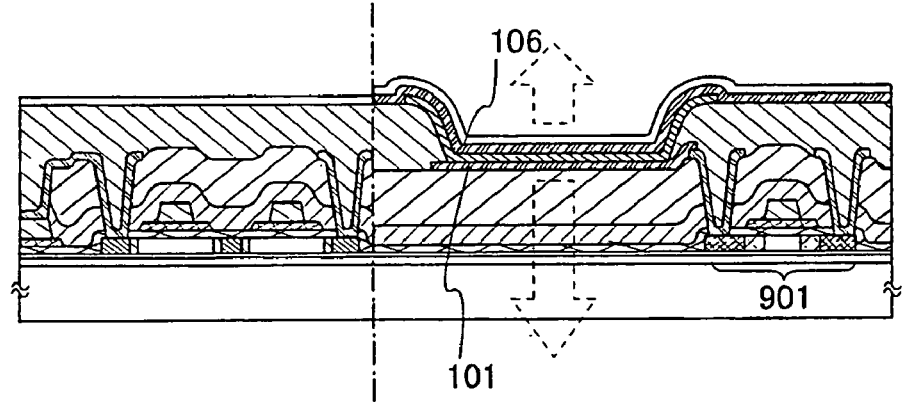
Figure 10C:
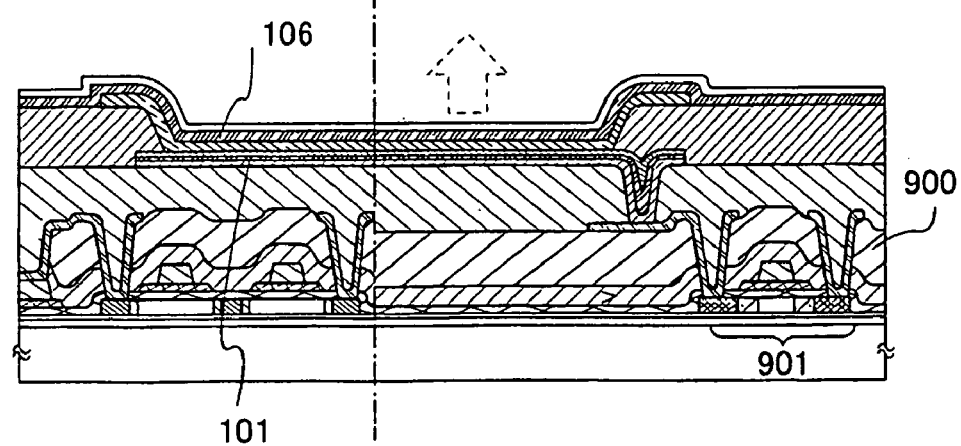

FIGS. 10A to 10C show examples of bottom emission, dual emission, and top emission, respectively. The structure whose manufacturing process has been described in Embodiment Mode 3 corresponds to the structure in FIG. 10C. FIGS. 10A and 10B show the structures in which a first interlayer insulating layer 900 in FIG. 10C is formed of a material having self-flattening properties and a wiring to be connected to a thin film transistor 901 and the first electrode 101 of the light-emitting element are formed over the same interlayer insulating layer. In FIG. 10A, the first electrode 101 in the light-emitting element is formed with a light-transmitting material, and light is emitted toward a lower part of the light-emitting device, which is called a bottom-emission structure. In FIG. 10B, the second electrode 106 is formed with a light-transmitting material such as ITO, ITSO, or IZO, and light is extracted from both sides, which is called a dual-emission structure. When a film is formed with aluminum or silver thickly, the film does not transmit light; however, the film transmits light when the film is formed thinly. Therefore, by forming the second electrode 106 with aluminum or silver in such a thickness that light can pass therethrough, dual emission can be achieved. Note that, in this embodiment mode, when voltage is applied so as to make a light emitting element emit light, the electrode applied with higher potential is the first electrode, and the electrode applied with lower potential is the second electrode. Further, FIG. 10C shows a top-emission structure in which the second electrode 106 in the light-emitting element is formed with a light-transmitting material, and light is emitted toward an upper part of the light-emitting device.

Embodiment Mode 7

This embodiment mode will describe a pixel circuit and a protective circuit in the panel and the module shown in Embodiment Mode 4, and their operations. FIGS. 5A to 6C show cross sectional views of a driver TFT 1403 and a light-emitting element 1405 in FIGS. 11A to 11F.

Figure 11A:
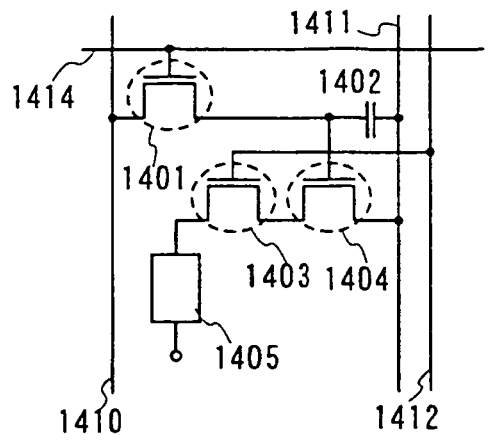
FIGS. 11A to 11F show examples of a pixel circuit of a display device according to the present invention.

A pixel shown in FIG. 11A includes a signal line 1410 and power source lines 1411 and 1412 in a column direction and a scan line 1414 in a row direction. The pixel further includes a switching TFT 1401, the driver TFT 1403, a current control TFT 1404, a capacitor 1402, and the light-emitting element 1405.

Figure 11B:
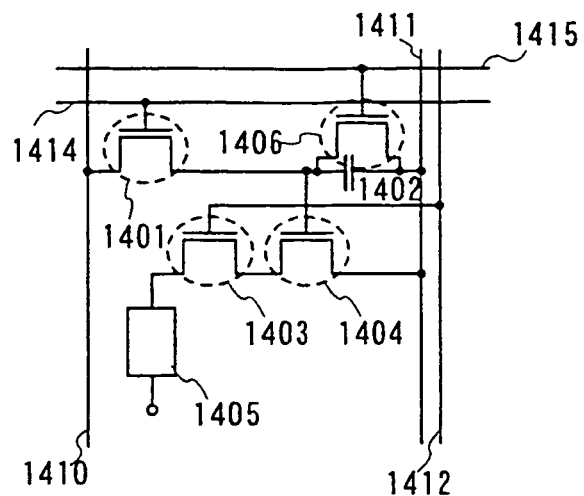
Figure 11C:
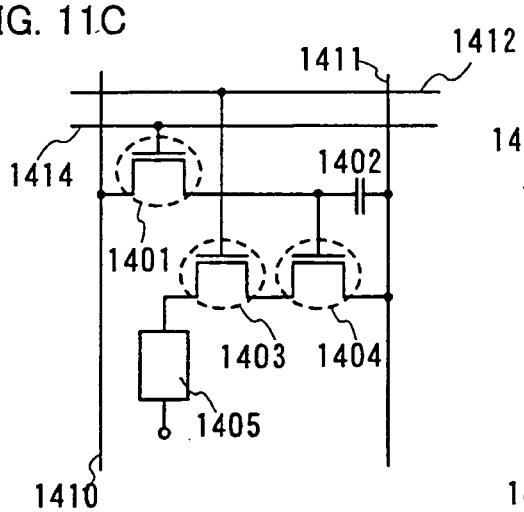
Figure 11D:
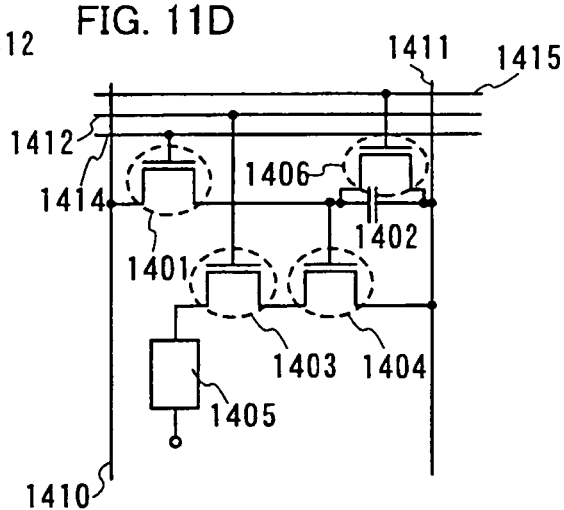

A pixel shown in FIG. 11C has the same structure as one in FIG. 11A except for that a gate electrode of the driver TFT 1403 is connected to the power source line 1412 provided in the row direction. In other words, the pixels shown in FIGS. 11A and 11C have the same equivalent circuit diagram. However, in the case of arranging the power source line 1412 in the column direction (FIG. 11A) and in the case of arranging the power source line 1412 in the row direction (FIG. 11C), each power source line is formed with a conductive film in different layers. Here, attention is paid to a wiring connected to the gate electrode of the driver TFT 1403, and the structure is shown separately in FIGS. 11A and 11C in order to show that these wirings are manufactured with different layers.

As a feature of the pixels shown in FIGS. 11A and 11C, the driver TFT 1403 and the current control TFT 1404 are connected serially within the pixel, and it is preferable to set the channel length L (1403) and the channel width W (1403) of the driver TFT 1403, and the channel length L (1404) and the channel width W (1404) of the current control TFT 1404 so as to satisfy L (1403)/W (1403):L (1404)/W (1404)=5 to 6000:1.

The driver TFT 1403 operates in a saturation region and serves to control the current value of the current flowing into the light-emitting element 1405. The current control TFT 1404 operates in a linear region and serves to control the current supply to the light-emitting element 1405. Both TFTs preferably have the same conductivity type in the manufacturing step, and the TFTs are n-channel type TFTs in this embodiment mode. The driver TFT 1403 may be either an enhancement type or a depletion type. Since the current control TFT 1404 operates in the linear region according to the present invention having the above structure, slight fluctuation of Vgs of the current control TFT 1404 does not affect the current value of the light-emitting element 1405. That is to say, the current value of the light-emitting element 1405 can be determined by the driver TFT 1403 operating in the saturation region. With the above structure, the unevenness of the luminance of the light-emitting element due to the variation of the characteristic of the TFT can be improved, thereby providing a display device in which the image quality is improved.

In the pixels shown in FIGS. 11A to 11D, the switching TFT 1401 is to control the input of the video signal to the pixel, and the video signal is inputted into the pixel when the switching TFT 1401 is turned on. Then, the voltage of the video signal is held in the capacitor 1402. Although FIGS. 11A and 11C show the structure in which the capacitor 1402 is provided, the present invention is not limited thereto. When the gate capacitance and the like can serve as a capacitor holding the video signal, the capacitor 1402 is not necessarily provided.

A pixel shown in FIG. 11B has the same pixel structure as that in FIG. 11A except for that a TFT 1406 and a scan line 1415 are added. In the same way, a pixel shown in FIG. 11D has the same pixel structure as that in FIG. 11C expect that the TFT 1406 and the scan line 1415 are added.

On and off of the TFT 1406 is controlled by the additionally provided scan line 1415. When the TFT 1406 is turned on, the charge held in the capacitor 1402 is discharged, thereby turning off the current control TFT 1404. In other words, by the provision of the TFT 1406, a state can be produced compellingly in which the current is not flowed into the light-emitting element 1405. For this reason, the TFT 1406 can be referred to as an eraser TFT. Consequently, in the structures shown in FIGS. 11B and 11D, a lighting period can be started at the same time as or just after the start of a writing period before the writing of the signal into all the pixels; therefore the duty ratio can be increased.

Figure 11E:
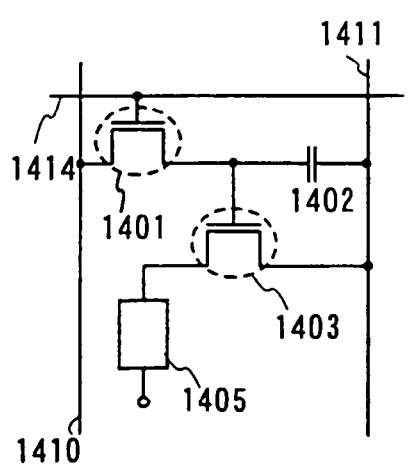
Figure 11F:
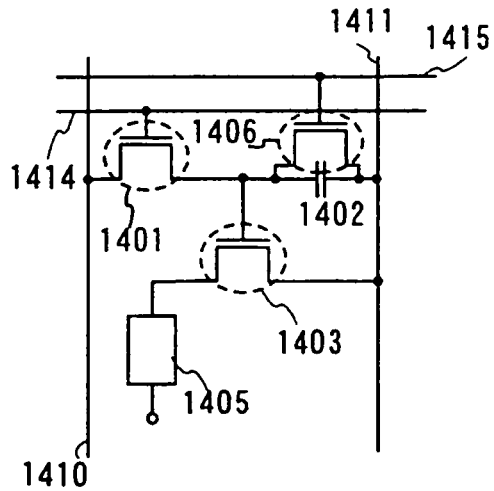

In a pixel shown in FIG. 11E, the signal line 1410 and the power source line 1411 are arranged in the column direction, and the scan line 1414 is arranged in the row direction. Further, the pixel includes the switching TFT 1401, the driver TFT 1403, the capacitor 1402, and the light-emitting element 1405. A pixel shown in FIG. 11F has the same pixel structure as that shown in FIG. 11E except for that the TFT 1406 and a scan line 1415 are added. In the structure shown in FIG. 11F, the duty ratio can also be increased by the provision of the TFT 1406.

As thus described, various pixel circuits can be employed. In particular, in the case of forming a thin film transistor from an amorphous semiconductor film, the semiconductor film for the driver TFT 1403 is preferably large. In the case where the semiconductor is large, in the above pixel circuit, a top emission type is preferable in which light from an electroluminescent layer is emitted from the sealing substrate side.

Such an active matrix light-emitting device can be driven at low voltage when the pixel density increases, because the TFTs are provided in respective pixels. Therefore, it is considered that the active matrix light-emitting device is advantageous.

Although this embodiment mode will describe the active matrix light-emitting device in which the respective TFTs are provided in respective pixels, a passive matrix light-emitting device can also be formed in which TFTs are provided in each column. Since the TFTs are not provided in respective pixels in the passive matrix light-emitting device, high aperture ratio can be obtained. In the case of a light-emitting device in which light is emitted to both sides of the electroluminescent layer, the transmissivity of the passive matrix display device is increased.

In the display device further comprising such pixel circuits according to the present invention, the drive voltage is low and increase in the drive voltage over time is small. Moreover, the display device has the respective characteristics.

Subsequently, a case will be described in which a diode is provided as a protective circuit on the scan line and the signal line with the use of an equivalent circuit shown in FIG. 11E.

Figure 12:
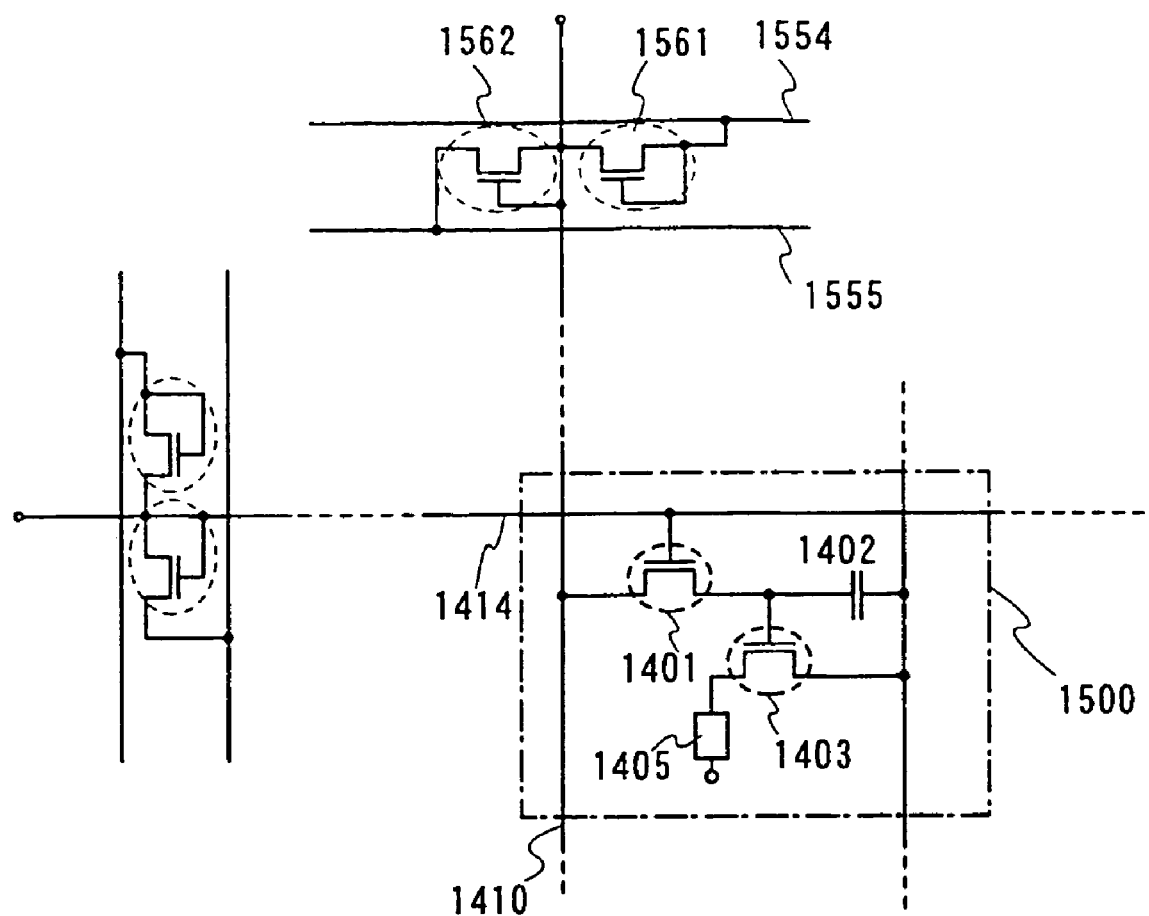
FIG. 12 shows an example of a protective circuit of a display device according to the present invention.

In FIG. 12, the switching TFT 1401, the driving TFT 1403, the capacitor 1402, and the light-emitting element 1405 are provided in a pixel area 1500. Diodes 1561 and 1562 are provided to the signal line 1410. In the similar way to the switching TFT 1401 and the driving TFT 1403, the diodes 1561 and 1562 are manufactured based on the above embodiment modes, and have a gate electrode, a semiconductor layer, a source electrode, a drain electrode, and the like. The diodes 1561 and 1562 are operated as diodes by connecting the gate electrode with the drain electrode or the source electrode.

Wirings 1554 and 1555 connecting to the diodes are formed with the same layer as the gate electrode. Therefore, in order to connect the wirings 1554 and 1555 with the source electrode or the drain electrode of the diode, it is necessary to form a contact hole in the gate insulating layer.

A diode provided on the scan line 1414 has the similar structure.

As thus described, according to the present invention, a protective diode to be provided on an input stage can be manufactured simultaneously. The position at which the protective diode is formed is not limited to this, and the diode may also be provided between the driver circuit and the pixel.

In the display device having such protective circuits according to the present invention, the increase in the drive voltage over time is small besides the drive voltage is low and the reliability of the display device can be improved.

Embodiment 1

This embodiment shows measurement data of a light-emitting element according to the present invention.

First, a manufacturing method of a light-emitting element in this embodiment is described. The light-emitting element in this embodiment conforms to the structure of the light-emitting element shown in Embodiment Mode 1. In this embodiment, a glass substrate is used as the insulator 100. ITO containing silicon is formed over the glass substrate by a sputtering method, thereby forming the first electrode 101. The thickness of the first electrode 101 is set to 110 nm.

Subsequently, the first hole-generating layer 102 is formed with molybdenum oxide (MoOx) and α-NPD by co-evaporating molybdenum oxide (VI) and α-NPD over the first electrode 101. Here, the thickness of the first hole-generating layer 102 is set to 50 nm. Note that the molar ratio of α-NPD and a molybdenum oxide (MoOx) is to be 1:1.

Next, the light-emitting layer 104 is formed over the first hole-generating layer 102. The light-emitting layer 104 is formed in a three-layer structure in which a hole-transporting layer, a layer where a light-emitting material is diffused, and an electron-transporting layer are stacked in order from the side of the first hole-generating layer 102. The hole-transporting layer is formed with α-NPD in 10 nm thick by a vacuum evaporating method. The layer in which the light-emitting material is diffused is formed with $Alq_3$ and coumarin 6 in 35 nm thick by a co-evaporating method. The electron-transporting layer is formed with only $Alq_3$ in 10 nm thick by a vacuum evaporating method. The layer in which the light-emitting material is diffused is adjusted so that the proportion between $Alq_3$ and coumarin 6 is 1:0.005 in weight ratio.

Subsequently, the electron-generating layer 105 is formed with $Alq_3$ and lithium in 10 nm thick by co-evaporating $Alq_3$ and lithium over the light-emitting layer 104. $Alq_3$ and lithium are adjusted so that the weight ratio between $Alq_3$ and lithium is 1:0.01.

Next, the second hole-generating layer 103 is formed with molybdenum oxide (MoOx) and α-NPD by co-evaporating molybdenum oxide (VI) and α-NPD over the electron-generating layer 105. Here, the thickness of the first hole-generating layer 102 is set to 20 nm. The molar ratio between α-NPD and a molybdenum oxide (MoOx) is 1:1.

The second electrode 106 is formed with aluminum in 100 nm thick over the second hole-generating layer 105.

When voltage is applied to the light-emitting element having the above structure according to the present invention, holes are injected from the second hole-generating layer 103 to the second electrode. Moreover, electrons are injected from the electron-generating layer 105 to the light-emitting layer 104. Further, holes are injected from the first hole-generating layer 102 to the light-emitting layer 104. Then, the injected holes and electrons are recombined in the light-emitting layer, thereby providing light from coumarin 6.

Figure 13:
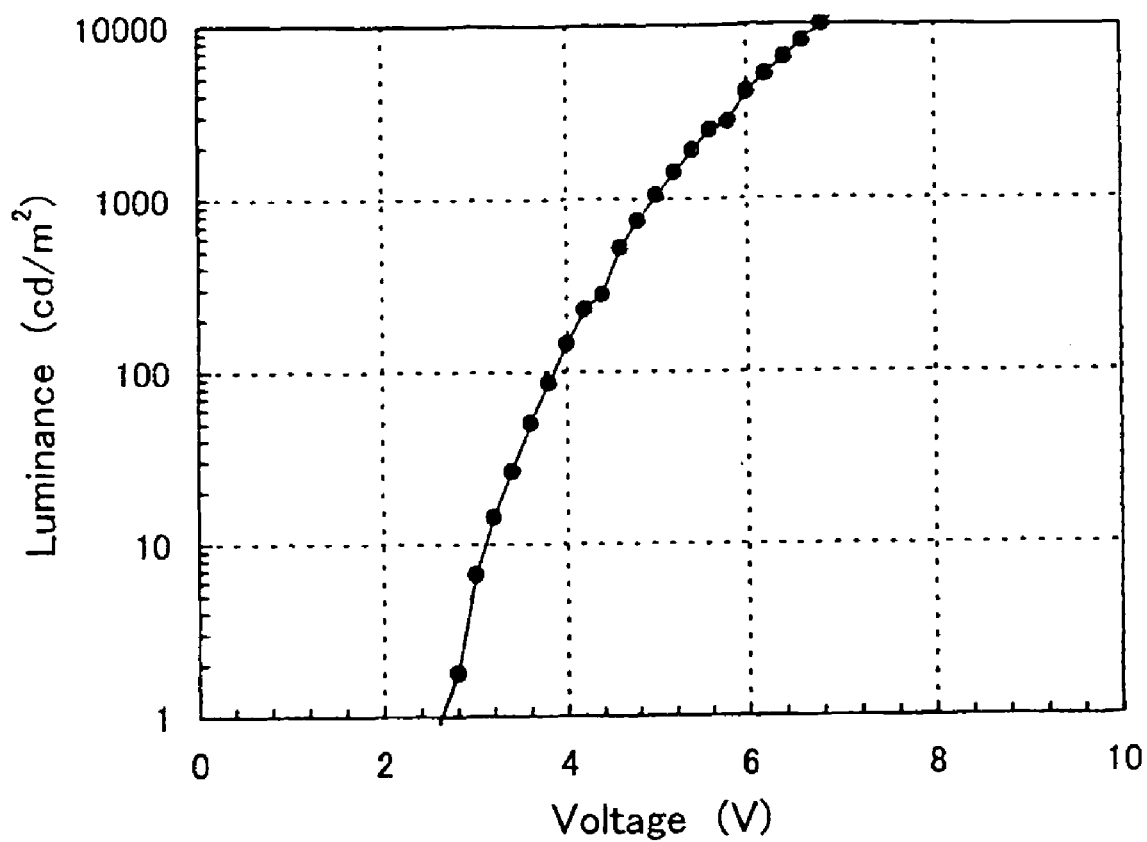
FIG. 13 is a graph showing the voltage-luminance characteristic of an element in Embodiment 1.
Figure 14:
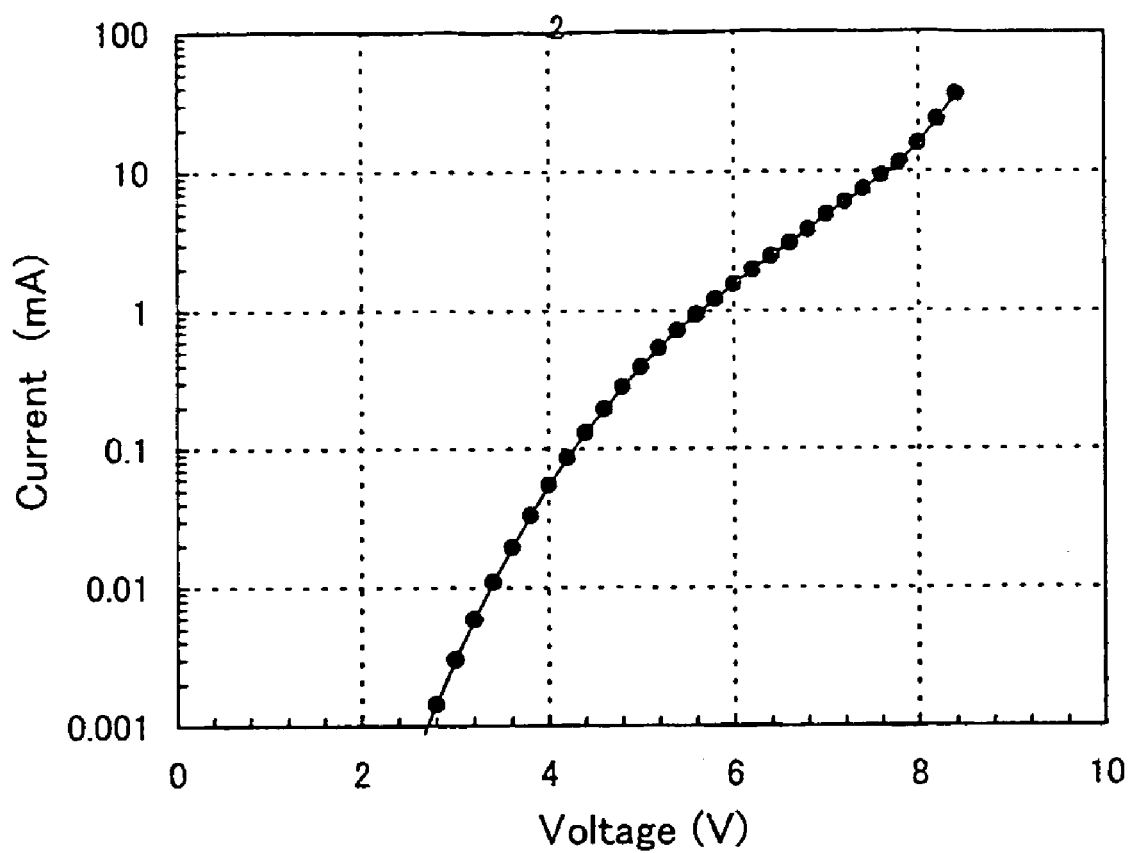
FIG. 14 is a graph showing the voltage-current characteristic of an element in Embodiment 1.

FIG. 13 shows the voltage-luminance characteristic of the thus manufactured light-emitting element of this embodiment, while FIG. 14 shows the voltage-current characteristic thereof. In FIG. 13, the horizontal axis shows the voltage (V), and the vertical axis shows the luminance ($cd/m^2$). In FIG. 14, the horizontal axis shows the voltage (V), and the vertical axis shows the current (mA).

Thus, the light-emitting element in this embodiment exhibits superior characteristic.

Note that, in this embodiment mode, when voltage is applied so as to make a light emitting element emit light, the electrode applied with higher potential is the first electrode, and the electrode applied with lower potential is the second electrode. A light emitting element of this embodiment has a structure in which the light emitting layer 104 is provided between the first hole generating layer 102 in contact with the first electrode and the second hole generating layer 103 in contact with the second electrode. The thickness of the second hole generating layer 103 is not thicker or thinner than that of the first hole generating layer 102 by more than 50%. Further, the thickness of the first hole generating layer 102 is not thicker or thinner than that of the second hole generating layer 103 by more than 50%. Each of the hole generating layers has a thickness in the range of 30 nm to 1 μm. Further, the difference between the molar ratio of the molybdenum oxide (MoOx) to α-NPD forming the second hole generating layer 103 and the molar ratio of the molybdenum oxide (MoOx) to α-NPD forming the first hole generating layer 102 is in the range of 80% of the molar ratio of the molybdenum oxide (MoOx) to α-NPD forming the second hole generating layer 103 and also in the range of 80% of the molybdenum oxide (MoOx) to α-NPD forming the first hole generating layer 102.

Accordingly, the stress to the light emitting layer can be alleviated, so that the reliability of the light emitting element can be improved.

Embodiment 2

This embodiment describes a manufacturing method of four light-emitting elements having different mixture proportions between a hole-transporting material and an electron-accepting material which shows electron-accepting properties to the hole-transporting material in a hole-generating layer. The four light-emitting elements are denoted by a light-emitting element (1), a light-emitting element (2), a light-emitting element (3), and a light-emitting element (4). Moreover, this embodiment describes the characteristics of these elements.

First, the manufacturing method of the light-emitting element in this embodiment is described. In this embodiment, the light-emitting element conforms to the structure of the light-emitting element shown in Embodiment Mode 1. In this embodiment, a glass substrate is used as the insulator 100. ITO containing silicon is formed over the glass substrate by a sputtering method, thereby forming the first electrode 101. The thickness of the first electrode 101 is set to 110 nm.

Subsequently, the first hole-generating layer 102 is formed with molybdenum oxide (MoOx) over the first electrode 101 by a vacuum evaporating method. Here, the thickness of the first hole-generating layer 102 is set to 5 nm.

Next, the light-emitting layer 104 is formed over the first hole-generating layer 102. The light-emitting layer 104 is formed in a three-layer structure in which a hole-transporting layer, a layer where a light-emitting material is diffused, and an electron-transporting layer are stacked in order from the side of the first hole-generating layer 102. The hole-transporting layer is formed with α-NPD in 55 nm thick by a vacuum evaporating method. The layer in which the light-emitting material is diffused is formed with $Alq_3$ and coumarin 6 in 35 nm thick by a co-evaporating method. The electron-transporting layer is formed with only $Alq_3$ in 10 nm thick by a vacuum evaporating method. The layer in which the light-emitting material is diffused is adjusted so that the proportion between $Alq_3$ and coumarin 6 is 1:0.005 in weight ratio.

Subsequently, the electron-generating layer 105 is formed with $Alq_3$ and lithium in 10 nm thick by co-evaporating $Alq_3$ and lithium over the light-emitting layer 104. $Alq_3$ and lithium are adjusted so that the weight ratio between $Alq_3$ and lithium is 1:0.01.

Next, the second hole-generating layer 103 is formed with molybdenum oxide (MoOx) and α-NPD by co-evaporating molybdenum oxide (VI) and α-NPD over the electron-generating layer 105. Here, the light-emitting element (1) is adjusted so that the molar ratio of α-NPD to a molybdenum oxide (MoOx) is 0.5 (=molybdenum oxide (MoOx)/α-NPD). The light-emitting element (2) is adjusted so that the molar ratio of α-NPD to molybdenum oxide (MoOx) is 1.0 (=molybdenum oxide (MoOx)/α-NPD). The light-emitting element (3) is adjusted so that the molar ratio of α-NPD to molybdenum oxide (MoOx) is 1.5 (=molybdenum oxide (MoOx)/α-NPD). The light-emitting element (4) is adjusted so that the molar ratio of α-NPD to molybdenum oxide (MoOx) is 2.0 (=molybdenum oxide (MoOx)/α-NPD). The thickness of the first hole-generating layer 102 is set to 20 nm.

The second electrode 106 is formed with aluminum in 100 nm thick over the second hole-generating layer 103. Note that, in this embodiment mode, when voltage is applied so as to make a light emitting element emit light, the electrode applied with higher potential is the first electrode, and the electrode applied with lower potential is the second electrode.

When voltage is applied to the light-emitting element having the above structure according to the present invention, holes are injected from the second hole-generating layer 103 to the second electrode. Moreover, electrons are injected from the electron-generating layer 105 to the light-emitting layer 104. Further, holes are injected from the first hole-generating layer 102 to the light-emitting layer 104. Then, the injected holes and electrons are recombined in the light-emitting layer, thereby providing light from coumarin 6.

Figure 15:
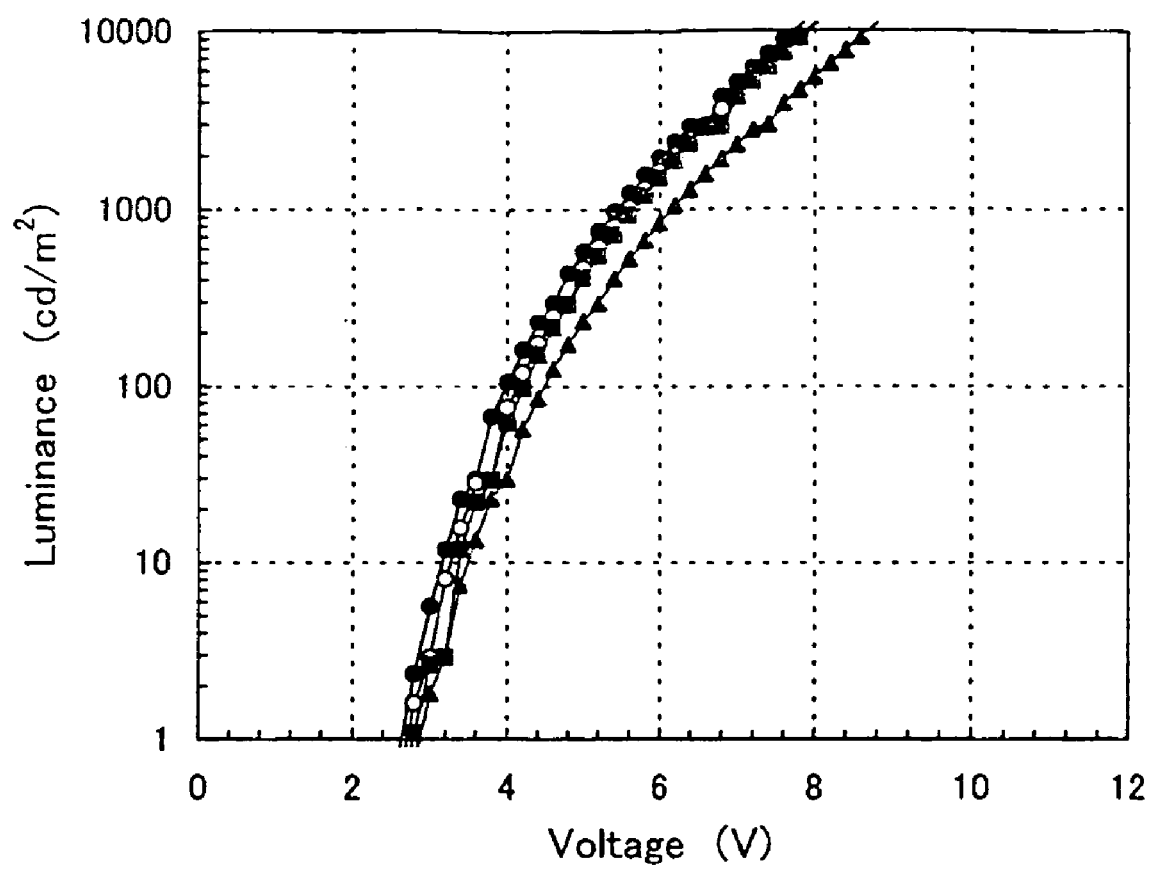
FIG. 15 is a graph showing the voltage-luminance characteristic of an element in Embodiment 2.
Figure 16:
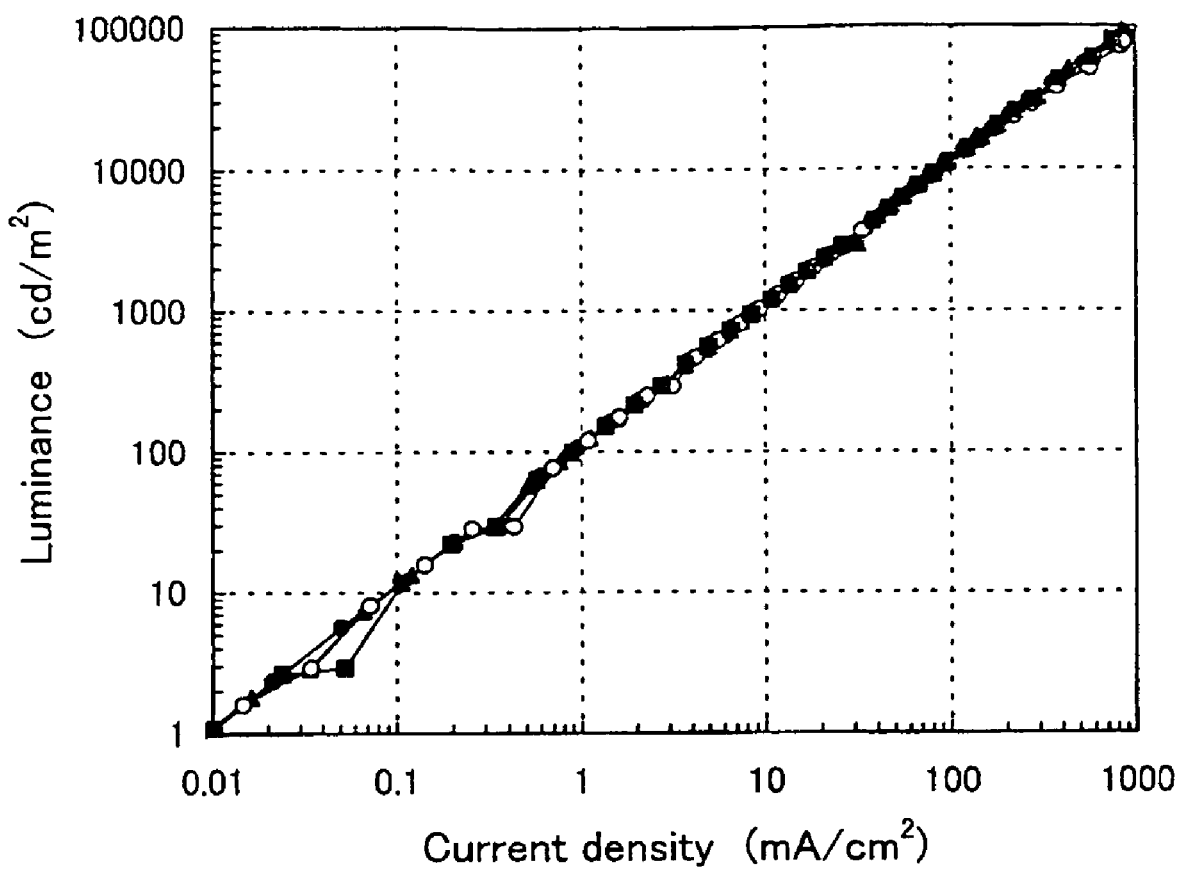
FIG. 16 is a graph showing the current density-luminance characteristic of an element in Embodiment 2.
Figure 17:
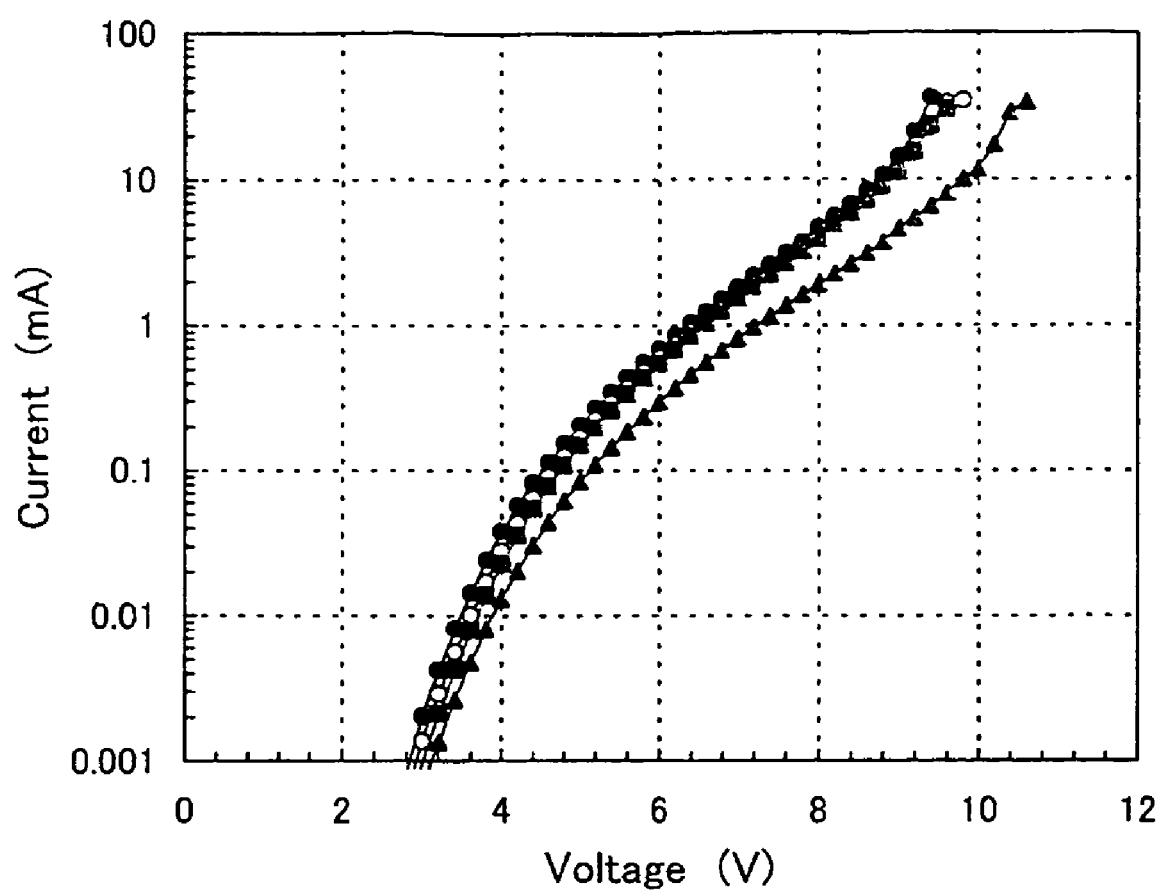
FIG. 17 is a graph showing the voltage-current characteristic of an element in Embodiment 2.

FIG. 15 shows the voltage-luminance characteristic of the light-emitting element in the present embodiment. FIG. 16 shows the current density-luminance characteristic thereof, and FIG. 17 shows the voltage-current characteristic thereof. In FIG. 15, the horizontal axis shows the voltage (V) and the vertical axis shows the luminance ($cd/m^2$). In FIG. 16, the horizontal axis shows the current density ($mA/cm^2$) and the vertical axis shows the luminance ($cd/m^2$). In FIG. 17, the horizontal axis shows the voltage (V) and the vertical axis shows the current (mA). In FIGS. 15 to 17, ▲ shows the characteristic of the light-emitting element (1), ● shows the characteristic of the light-emitting element (2), ○ shows the characteristic of the light-emitting element (3), and ■ shows the characteristic of the light-emitting element (4).

It is to be understood from FIGS. 15 to 17 that all of the light-emitting elements operate well. In the light-emitting elements (2) to (4) in which the molar ratio of α-NPD to molybdenum oxide (MoOx) in the hole generating layer (=α-NPD/molybdenum oxide (MoOx)) ranges from 1 to 2, high luminance is obtained by applying any voltage and high current value is also obtained. Thus, the light-emitting element can be obtained which operates at lower drive voltage by adjusting the molar ratio of α-NPD to molybdenum oxide (=α-NPD/molybdenum oxide) to be in the range of 1 to 2.

Next, a result of a continuously lighting test of the light-emitting elements of the present embodiment is described. After the light-emitting element manufactured as above is sealed under nitrogen atmosphere, the continuously lighting test is conducted at normal temperature in the following way.

Figure 18:
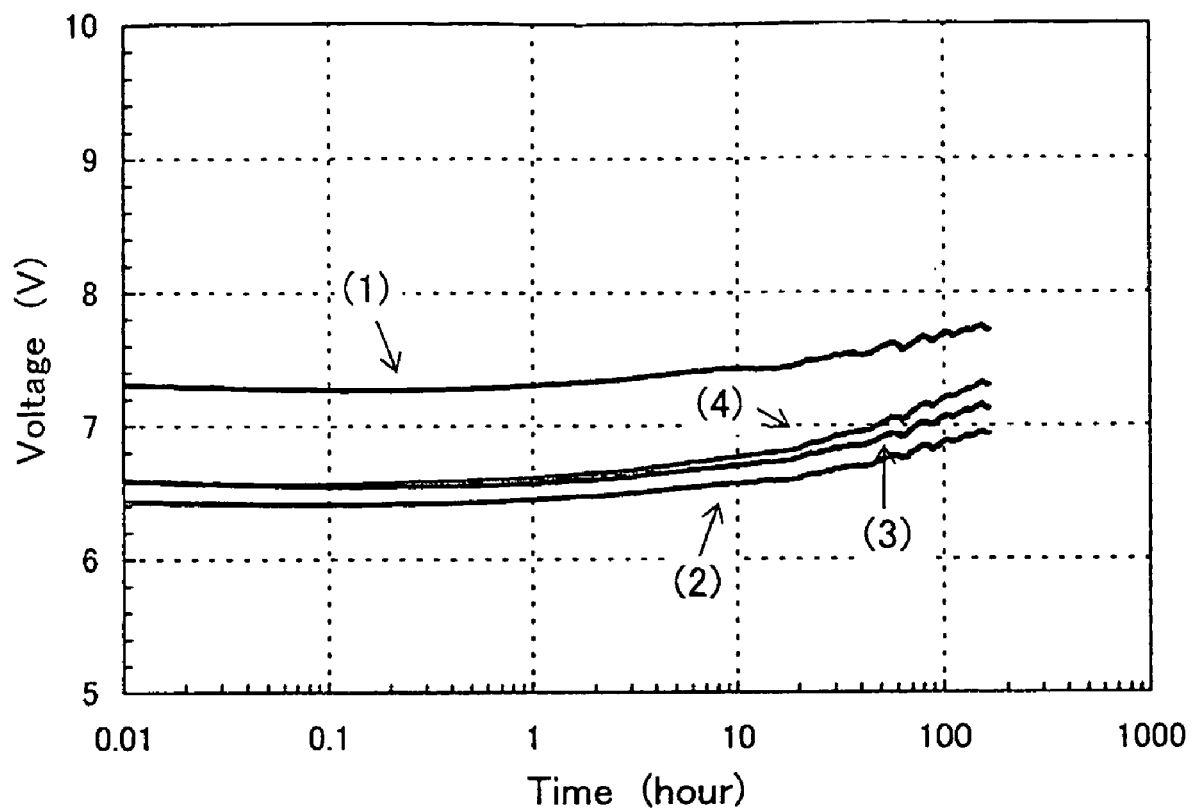
FIG. 18 is a graph showing the change of voltage of an element over time in Embodiment 2.
Figure 19:
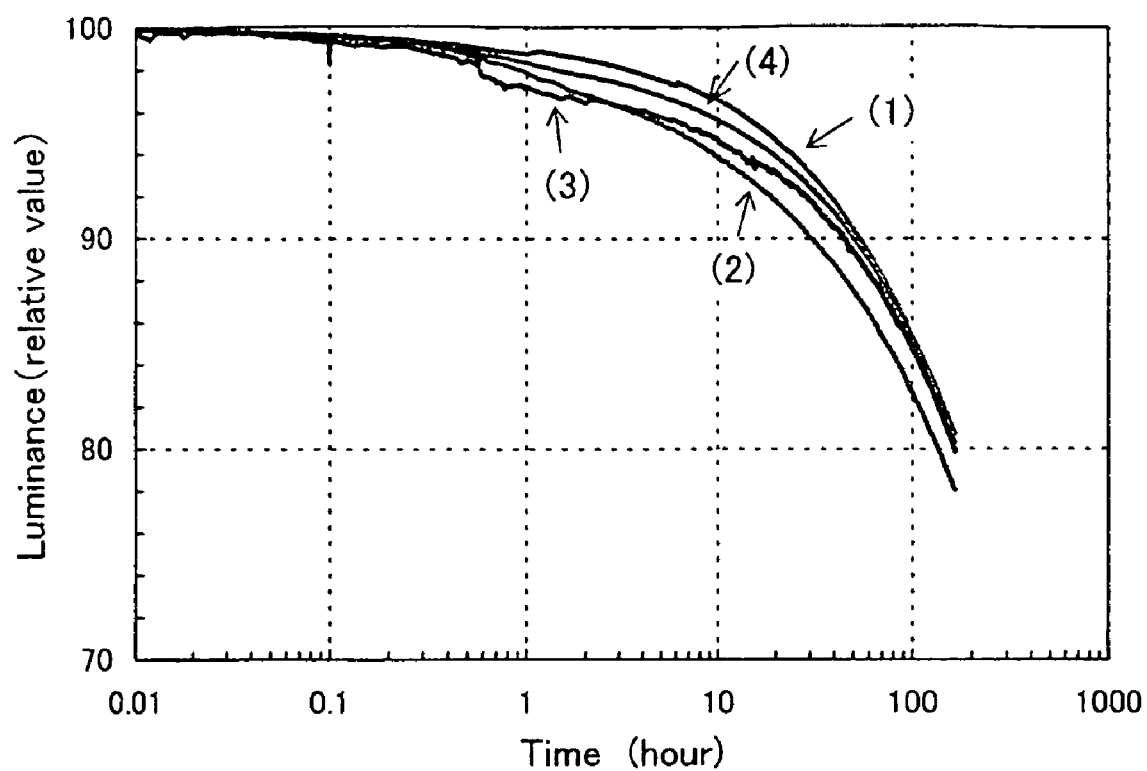
FIG. 19 is a graph showing the change of luminance of an element over time in Embodiment 2.

As is clear from FIG. 16, the current density of 26.75 $mA/cm^2$ is required when the light is emitted with the luminance of 3000 $cd/m^2$ in an initial state of the light-emitting element of the present invention. In this embodiment, the current of 26.75 $mA/cm^2$ keeps to be flowed for a certain period of time, and data are collected on the change of the voltage required to flow the current of 26.75 $mA/cm^2$ over time and the change of the luminance over time. FIGS. 18 and 19 show the collected data. In FIG. 18, the horizontal axis shows the passed time (hour), while the vertical axis shows the voltage (V) required for flowing the current of 26.75 $mA/cm^2$. In FIG. 19, the horizontal axis shows the passed time (hour), while the vertical axis shows the luminance (any unit of measure). It is to be noted that the luminance (any unit of measure) is a relative value to the initial luminance expressed by assuming that the initial luminance be 100. The relative value is obtained in such a way that the luminance at a particular time is divided by the initial luminance and multiplied by 100.

It is to be understood from FIG. 18 that after 100 hours have passed, the voltage required for flowing the current having the current density of 26.75 $mA/cm^2$ is only approximately 1 V higher than that in the initial state. This indicates that the light-emitting element of the present invention is a superior element in which the increase in the drive voltage over time is small.

In the light-emitting elements shown in Embodiments 1 and 2, layers serving as the hole-injecting layer, the hole-transporting layer, the electron-transporting layer, and the like are formed in addition to the layer serving as the light-emitting layer. However, these layers are not always necessary. Further, in Embodiments 1 and 2, after the layer serving as the light-emitting layer is formed, the electron-generating layer is formed, and then the hole-generating layer is formed. However, the manufacturing method of the light-emitting element according to the present invention is not limited to this. For example, after the hole-generating layer is formed, the electron-generating layer may be formed, and then the layer serving as the light-emitting layer may be formed. The present application is based on Japanese Priority Application No. 2004-288972 filed on Sep. 30, 2004 with the Japanese Patent Office, the entire contents of which are hereby incorporated by reference.

EXPLANATION OF REFERENCE

100: an insulator, 101: a first electrode, 102: a layer, 103: a layer, 104: a light emitting layer, 105: a layer, 106: a second electrode, 107: a layer, 50: a substrate, 51*a*: a base insulating layer, 51*b*: a base insulating layer, 52: a semiconductor layer, 53: a gate insulating layer, 54: a gate electrode, 59: an insulating film (hydride film), 60: an interlayer insulating layer, 61*a*: connection portion, 61*b*: a wiring, 63: an interlayer insulating layer, 65: a bank, 66: a light-emitting stack, 70: a thin film transistor, 88: a resin, 89: a desiccant, 90: a polarizing plate, 91: a protective film, 93: a light emitting element, 94: a counter substrate, 900: an interlayer insulating layer, 901: a thin film transistor, 4001: a substrate, 4002: a pixel area, 4003: a signal line driver circuit, 4004: a scan line driver circuit, 4005: a sealant, 4006: a counter substrate, 4007: an filler, 4008: a thin film transistor, 4010: a thin film transistor, 4011: a light emitting element, 4014: a wiring, 4015*a*: a wiring, 4015*b*: a wiring, 4016: a connection terminal, 4018: a flexible printed circuit (an FPC), 4019: an anisotropic conductive film, 2001: a case, 2003: a display portion, 2004: a speaker area, 2101: a main body, 2102: a case, 2103: a display portion, 2104: a voice input area, 2105: a sound reproducer, 2106: operation keys, 2108: an antenna, 2201: a main body, 2202: a case, 2203: a display portion, 2204: a keyboard, 2205: an external connection portion, 2206: a pointing mouse, 2301: a main body, 2302: a display portion, 2303: a switch, 2304: operation keys, 2305: an IR port, 2401: a case, 2402: a display portion, 2403: a speaker area, 2404: operation keys, 2405: an recording medium insert portion, 1401: a switching TFT, 1402: a capacitor, 1403: a driving TFT, 1404: a current control TFT, 1405: a light emitting element, 1406: a TFT, 1410: a signal line, 1411: a power source line, 1412: a power source line, 1414: a scan line, 1415: a scan line, 1500: a pixel area, 1561: a diode, 1554: a wiring, 1555: a wiring.

The invention claimed is:

1. A light emitting element comprising:
a first electrode and a second electrode;
a first layer and a second layer each generating holes;
a third layer containing a light emitting material; and
a fourth layer generating electrons,
wherein the first layer is in direct contact with the first electrode,
the second layer is in direct contact with the second electrode,
the third layer is provided between the first electrode and the second electrode with the first layer and the second layer respectively therebetween, and
the fourth layer is provided between the third layer and the second layer.

2. A light emitting element according to claim 1, wherein a thickness of each of the first layer and the second layer is 30 nm to 1 μm.

3. A light emitting element according to claim 1, wherein a thickness of the second layer is 50% to 150% of a thickness of the first layer, and the thickness of the first layer is 50% to 150% of the thickness of the second layer.

4. A light emitting element according to claim 1, wherein t voltage is applied so as to make the light emitting element emit light, the electrode applied with higher potential is the first electrode, and the electrode applied with lower potential is the second electrode.

5. A light emitting element comprising:
a first electrode and a second electrode;
a first layer and a second layer each containing a P-type semiconductor;
a third layer containing a light emitting material; and
a fourth layer containing an N-type semiconductor,
wherein the first layer is in direct contact with the first electrode,
the second layer is in direct contact with the second electrode,
the third layer is provided between the first electrode and the second electrode with the first layer and the second layer respectively therebetween, and
the fourth layer is provided between the third layer and the second layer.

6. A light emitting element according to claim 5, wherein the P-type semiconductor is a metal oxide.

7. A light emitting element according to claim 5, wherein the P-type semiconductor is one or more compounds selected from the group consisting of vanadium oxide, molybdenum oxide, cobalt oxide, and nickel oxide.

8. A light emitting element according to claim 5, wherein the N-type semiconductor is a metal oxide.

9. A light emitting element according to claim 5, wherein the N-type semiconductor is one or more compounds selected from the group consisting of zinc oxide, zinc sulfide, zinc selenide, and titanium oxide.

10. A light emitting element according to claim 5, wherein a thickness of each of the first layer and the second layer is 30 nm to 1 μm.

11. A light emitting element according to claim 5, wherein a thickness of the second layer is 50% to 150% of a thickness of the first layer, and the thickness of the first layer is 50% to 150% of the thickness of the second layer.

12. A light emitting element according to claim 5, wherein t voltage is applied so as to make the light emitting element emit light, the electrode applied with higher potential is the first electrode, and the electrode applied with lower potential is the second electrode.

13. A light emitting element according to claim 1, wherein the light emitting element is incorporated in one selected from the group consisting of a television, a mobile phone, a computer, and a game machine.

14. A light emitting element according to claim 5, wherein the light emitting element is incorporated in one selected from the group consisting of a television, a mobile phone, a computer, and a game machine.

15. A light emitting element comprising:
a first electrode over a substrate;
a first layer generating holes over and in direct contact with the first electrode;
a third layer containing a light emitting material over the first layer;
a fourth layer generating electrons over the third layer;
a second layer generating holes over the fourth layer; and
a second electrode over and in direct contact with the second layer.

16. A light emitting element according to claim 15, wherein a thickness of each of the first layer and the second layer is 30 nm to 1 μm.

17. A light emitting element according to claim 15, wherein a thickness of the second layer is 50% to 150% of a thickness of the first layer, and the thickness of the first layer is 50% to 150% of the thickness of the second layer.

18. A light emitting element according to claim 15, wherein t voltage is applied so as to make the light emitting element emit light, the electrode applied with higher potential is the first electrode, and the electrode applied with lower potential is the second electrode.

19. A Tight emitting element according to claim 15, wherein the light emitting element is incorporated in one selected from the group consisting of a television, a mobile phone, a computer, and a game machine.

20. A light emitting element comprising:
a first electrode over a substrate;
a first layer containing a P-type semiconductor over and in direct contact with the first electrode;
a third layer containing a light emitting material over the first layer;
a fourth layer containing an N-type semiconductor over the third layer;
a second layer containing a P-type semiconductor over the fourth layer; and
a second electrode over and in direct contact with the second layer.

21. A light emitting element according to claim 20, wherein the P-type semiconductor is a metal oxide.

22. A light emitting element according to claim 20, wherein the P-type semiconductor is one or more compounds selected from the group consisting of vanadium oxide, molybdenum oxide, cobalt oxide, and nickel oxide.

23. A light emitting element according to claim 20, wherein the N-type semiconductor is a metal oxide.

24. A light emitting element according to claim 20, wherein the N-type semiconductor is one or more compounds selected from the group consisting of zinc oxide, zinc sulfide, zinc selenide, and titanium oxide.

25. A light emitting element according to claim 20, wherein a thickness of each of the first layer and the second layer is 30 nm to 1 μm.

26. A light emitting element according to claim 20, wherein a thickness of the second layer is 50% to 150% of a thickness of the first layer, and the thickness of the first layer is 50% to 150% of the thickness of the second layer.

27. A light emitting element according to claim 20, wherein t voltage is applied so as to make the light emitting element emit light, the electrode applied with higher potential is the first electrode, and the electrode applied with lower potential is the second electrode.

28. A light emitting element according to claim 20, wherein the light emitting element is incorporated in one selected from the group consisting of a television, a mobile phone, a computer, and a game machine.

* * * * *

UNITED STATES PATENT AND TRADEMARK OFFICE
CERTIFICATE OF CORRECTION

PATENT NO. : 7,737,626 B2  Page 1 of 1
APPLICATION NO. : 10/581410
DATED : June 15, 2010
INVENTOR(S) : Daisuke Kumaki, Satoshi Seo and Shunpei Yamazaki It is certified that error appears in the above-identified patent and that said Letters Patent is hereby corrected as shown below:

In The Claims:

Column 33, Claim 19, Line 23, Change "Tight" to -- light --.

Signed and Sealed this

Second Day of November, 2010

David J. Kappos
*Director of the United States Patent and Trademark Office*